(12) United States Patent
Shen et al.

(10) Patent No.: US 10,374,754 B2
(45) Date of Patent: Aug. 6, 2019

(54) POLAR CODE RATE MATCHING METHOD AND APPARATUS, AND WIRELESS COMMUNICATIONS DEVICE

(71) Applicant: Huawei Technologies Co., Ltd., Shenzhen (CN)

(72) Inventors: Hui Shen, Shenzhen (CN); Bin Li, Shenzhen (CN)

(73) Assignee: HUAWEI TECHNOLOGIES CO., LTD., Shenzhen (CN)

(*) Notice: Subject to any disclaimer, the term of this patent is extended or adjusted under 35 U.S.C. 154(b) by 227 days.

(21) Appl. No.: 15/608,060

(22) Filed: May 30, 2017

(65) Prior Publication Data

US 2017/0264394 A1 Sep. 14, 2017

Related U.S. Application Data

(63) Continuation of application No. PCT/CN2014/092343, filed on Nov. 27, 2014.

(51) Int. Cl.
*H04L 1/00* (2006.01)
*H03M 13/00* (2006.01)
(Continued)

(52) U.S. Cl.
CPC .......... *H04L 1/0071* (2013.01); *H03M 13/13* (2013.01); *H03M 13/27* (2013.01);
(Continued)

(58) Field of Classification Search
CPC ..... G01C 21/32; H04L 1/0013; H04L 1/0071; H04L 1/0068; H04L 1/0041; H04L 1/0067; H04L 1/1812; H03M 13/6362
See application file for complete search history.

(56) References Cited

U.S. PATENT DOCUMENTS 6,304,985 B1 10/2001 Sindhushayana et al.
10,148,289 B2 * 12/2018 Shen ..................... H03M 13/13
(Continued)

FOREIGN PATENT DOCUMENTS

CN 102694625 A 9/2012
CN 103023618 A 4/2013
(Continued)

OTHER PUBLICATIONS

Machine Translation and Abstract of Japanese Publication No. JP2006013846, Jan. 12, 2006, 53 pages.
(Continued)

*Primary Examiner* — Phung M Chung
(74) *Attorney, Agent, or Firm* — Conley Rose, P.C.

(57) ABSTRACT

The present disclosure discloses a polar code rate matching method and apparatus and a wireless communications device that includes performing sorting processing on the first sequence Z according to a preset rule to determine a second sequence, wherein the first sequence Z is determined based on a Mersenne twister algorithm according to a code length of a target polar code, and interleaving the target polar code according to a mapping function to generate interleaved output bits, wherein the mapping function is determined according to the first sequence Z and the second sequence. A Mersenne twister algorithm is applied to target polar code rate matching such that a bit sequence obtained from the rate matching can be more even in structure, a frame error rate of a punctured polar code can be reduced, hybrid automatic repeat request (HARQ) performance can be improved, and further, communication reliability can be improved.

21 Claims, 7 Drawing Sheets

(51) Int. Cl.
*H04N 19/00* (2014.01)
*H03M 13/13* (2006.01)
*H03M 13/27* (2006.01)

(52) U.S. Cl.
CPC ... *H03M 13/2742* (2013.01); *H03M 13/6306* (2013.01); *H03M 13/6362* (2013.01); *H04L 1/0041* (2013.01); *H04L 1/0068* (2013.01); *H04N 19/00* (2013.01)

(56) References Cited

U.S. PATENT DOCUMENTS

| | | | |
|---|---|---|---|
| 2009/0049359 A1 | 2/2009 | Malladi et al. | |
| 2010/0058136 A1* | 3/2010 | Lee | H03M 13/2957 714/748 |
| 2011/0200029 A1 | 8/2011 | Farmandar et al. | |
| 2011/0280186 A1 | 11/2011 | Rasquinha | |
| 2012/0307928 A1 | 12/2012 | Jia et al. | |
| 2013/0343271 A1 | 12/2013 | El-Khamy et al. | |
| 2014/0169492 A1* | 6/2014 | Mahdavifar | H03M 13/13 375/267 |
| 2015/0194987 A1 | 7/2015 | Li et al. | |
| 2016/0269050 A1* | 9/2016 | Shen | H03M 13/13 |
| 2016/0352464 A1* | 12/2016 | Shen | H03M 13/13 |
| 2017/0288703 A1* | 10/2017 | Shen | H03M 13/15 |

FOREIGN PATENT DOCUMENTS

| | | | |
|---|---|---|---|
| CN | 103684477 A | 3/2014 | |
| GB | 2465419 A | 5/2010 | |
| JP | 2006013846 A | 1/2006 | |
| RU | 2516321 C2 | 5/2014 | |
| RU | 2518509 C2 | 6/2014 | |

OTHER PUBLICATIONS

Nortel Networks, et al., "Text proposal for Section 6.2.4 of TR 25.892," 3GPP TSG RAN 1 Ad-Hoc, R1-040041, Jan. 27-30, 2004, 2 pages.

Mediatek Inc, et al.,"Design of DL transport Channel Processing and Multiplexing," 3GPP TSG-RAN WG1 Meeting #76, R1-140250, Feb. 10-14, 2014, 6 pages.

Matsumoto, M., "Mersenne Twister: A 623-Dimensionally Equidistributed Uniform Pseudo-Random Number Generator," ACM Transactions on Modeling and Computer Simulation (TOMACS)—Special issue on uniform random number generation Tomacs Homepage archive, vol. 8, Issue 1, Jan. 1998, 28 pages.

Jung-Fu, T., et al., "Coding Performance of HARQ with BICM—Part II: LTE Circular Buffer Rate Matching and Extension," IEEE 21st International Symposium on Personal Indoor and Mobile Radio Communications (PIMRC), Sep. 2010, pp. 982-987.

Foreign Communication From a Counterpart Application, Japanese Application No. 2017-528504, Japanese Office Action dated Jun. 4, 2018, 4 pages.

Foreign Communication From a Counterpart Application, Japanese Application No. 2017-528504, English Translation of Japanese Office Action dated Jun. 4, 2018, 5 pages.

Foreign Communication From a Counterpart Application, Chinese Application No. 2017122288, Chinese Notice of Allowance and Translation dated Jul. 12, 2018, 26 pages.

Kalyana, R., et al., "Performance Analysis of Modified Random Based Interleaver for OFDM-IDMA system" KP032727166, IEEE International Conference on Advanced Communication Control and Computing Technologies, May 8, 2014, pp. 896-900.

Figueiredo, F., et al., "LTE-Advanced Channel Coding Generic Procedures" XP032441155, Wireless Telecommunications Symposium, Apr. 17, 2013, 7 pages.

Foreign Communication From a Counterpart Application, European Application No. 14906664.9, Extended European Search Report dated Oct. 27, 2017, 9 pages.

Machine Translation and Abstract of Chinese Publication No. CN102694625, Sep. 26, 2012, 13 pages.

Machine Translation and Abstract of Chinese Publication No. CN103023618, Apr. 3, 2013, 10 pages.

Cadambe, V., et al., "Interference Alignment and Spatial Degrees of Freedom for the K User Interference Channel," 2008, pp. 971-975.

Foreign Communication From a Counterpart Application, PCT Application No. PCT/CN2014/092343, English Translation of International Search Report dated Sep. 2, 2015, 2 pages.

Foreign Communication From a Counterpart Application, PCT Application No. PCT/CN2014/092343, English Translation of Written Opinion dated Sep. 2, 2015, 6 pages.

Foreign Communication From a Counterpart Application, Chinese Application No. 201480083603.0, Chinese Search Report dated Feb. 18, 2019, 2 pages.

Foreign Communication From a Counterpart Application, Chinese Application No. 201480083603.0, Chinese Office Action dated Feb. 27, 2019, 3 pages.

\* cited by examiner

POLAR CODE RATE MATCHING METHOD AND APPARATUS, AND WIRELESS COMMUNICATIONS DEVICE

CROSS-REFERENCE TO RELATED APPLICATIONS

This application is a continuation of International Application No. PCT/CN2014/092343, filed on Nov. 27, 2014, the disclosure of which is hereby incorporated by reference in its entirety

TECHNICAL FIELD

Embodiments of the present disclosure relate to the encoding/decoding field, and more specifically, to a polar code rate matching method and apparatus, and a wireless communications device.

BACKGROUND

In a communications system, channel encoding is generally used to improve data transmission reliability and ensure communication quality. A polar code is a code of high quality that has been proved to be capable of achieving a Shannon capacity and have low coding-decoding complexity. The polar code is a linear block code. A generation matrix of the polar code is $G_N$, and an encoding process of the polar code is $x_1^N = u_1^N G_N$, where $G_N = B_N F^{\otimes n}$, a code length is $N=2n$, and $n \geq 0$.

$$F = \begin{bmatrix} 1 & 0 \\ 1 & 1 \end{bmatrix},$$

and $B_N$ is a transposed matrix such as a bit reversal (bit reversal) matrix. $F^{\otimes n}$ is a Kronecker power of F, and is defined as $F^{\otimes n} = F \otimes F^{\otimes n}$. A polar code may be expressed as $(N, K, A, u_{A^c})$ using a coset code, and an encoding process of the polar code is $x_1^N = u_A G_N(A) \oplus u_{A^c} G_N(A^c)$. A is an information bit index set. $G_N(A)$ is a submatrix obtained from a row that is in $G_N$ and that is corresponding to an index in the set A. $G_N(A^c)$ is a submatrix obtained from a row that is in $G_N$ and that is corresponding to an index in a set $A^c$. $u_{A^c}$ is a frozen bit, which is a known bit, and a quantity of frozen bits is (N−K). For simplicity, the frozen bits may be set to 0.

A polar code may be decoded by means of successive-cancellation (SC), decoding, and complexity of the SC decoding is $O(N \log_2 N)$. The SC decoding can achieve better performance and approach a Shannon capacity when a code length N is extremely large. However, when N is relatively small or middle large, SC decoding performance of the polar code does not exceed performance of a turbo code or a Low-density Parity-Check (LDPC) code. Therefore, the decoding performance needs to be further improved.

In SC decoding, decoding is performed sequentially bit by bit. A hard decision is performed after each bit is decoded, and then the bit is used in subsequent bit decoding. In this case, error transmission may occur, and decoding performance may be reduced. In list decoding, multiple candidate paths are kept, and decoding performance that approaches maximum likelihood can be achieved. SC-list decoding is obtained by combining SC decoding and list decoding. In existing SC-list decoding, a fixed quantity L of survivor paths is used, decoding complexity is $O(L \times N \times \log_2 N)$, and the complexity is relatively high.

In addition, in an SC-list decoding process, a solution of cascading a cyclic redundancy check (CRC) code and a polar code may be used to increase a Hamming distance, and improve performance of a code in a high signal to noise ratio (SNR) range. A simulation result indicates that performance of the cascading solution is better than the performance of a turbo code and the performance of an LDPC code. However, if a value of an existing fixed quantity of survivor paths is extremely small, a requirement for hybrid automatic repeat request (HARQ) performance in decoding cannot be satisfied. If the value is extremely large, decoding complexity increases, and the performance of the cascading solution is poorer than the performance of a turbo code and the performance of an LDPC code.

Therefore, in a current rate matching method, HARQ performance is relatively poor when the decoding method is used. The current rate matching method is not applicable to polar codes of various code lengths, and has low universality, practicability, and communication reliability.

SUMMARY

Embodiments of the present disclosure provide a polar code rate matching method and apparatus, and a wireless communications device to improve HARQ performance of a polar code.

According to a first aspect, a polar code rate matching apparatus is provided. The polar code rate matching apparatus includes a first determining unit, configured to determine, based on a Mersenne twister algorithm, a first sequence according to a code length of a target polar code, a sorting unit, configured to perform, according to a preset rule, sorting processing on the first sequence determined by the first determining unit, to determine a second sequence, a second determining unit, configured to determine a mapping function according to the first sequence determined by the first determining unit and the second sequence determined by the sorting unit, and an interleaving unit, configured to interleave, according to the mapping function determined by the second determining unit, the target polar code determined by the first determining unit, to generate interleaved output bits.

With reference to the first aspect, in a first possible implementation manner of the first aspect, the first determining unit is configured to determine the first sequence Z according to the following formulas:

$$X_{k+n} := X_{k+m} \oplus (X_k^{w-r} | X_{k+1}^r) A$$

$$V_k := X_{k+n} \oplus (X_{k+n} >> u)$$

$$H_k := V_k \oplus ((V_k << s) \& B)$$

$$Y_k := H_k \oplus ((H_k << t) \& C)$$

$$Z_k := Y_k \oplus (Y_k >> l)$$

where Z is the first sequence, V, H and Y are intermediate variables, $X_0, X_1, \ldots, X_{n-1}$ are n non-zero original integers, the non-zero original integer has w digits, $X_k^{w-r} | X_{k+1}^r$ represents an integer that has w digits and that is formed by sequentially splicing first (w−r) digits of $X_k$ and last r digits of $X_{k+1}$, $$A = \begin{pmatrix} & 1 & & & \\ & & 1 & & \\ & & & \ddots & \\ & & & & 1 \\ a_{w-1} & a_{w-2} & \ldots & \ldots & a_0 \end{pmatrix},$$

$a_{w-1}$, $a_{w-2}$, ... $a_0$ are specific parameters used for bit shifting, n, m, w, r, u, s, t, and l are specific positive integers, m is less than n, r is less than w, B and C are specific sequences, k is successively 0, 1, ..., N−1, and N is the code length of the target polar code.

With reference to the first possible implementation manner of the first aspect, in a second possible implementation manner of the first aspect, n=624, m=397, w=32, r=31, u=11, s=7, t=15, l=18, B=0x9d2c5680, and C=0xefc60000.

With reference to any one of the first aspect, or the first to the second possible implementation manners of the first aspect, in a third possible implementation manner of the first aspect, the polar code rate matching apparatus further includes a reversing unit, configured to perform reversing processing on the interleaved output bits.

With reference to any one of the first aspect, or the first to the second possible implementation manners of the first aspect, in a fourth possible implementation manner of the first aspect, the polar code rate matching apparatus further includes a replacement unit, configured to perform replacement processing on the interleaved output bits according to an information bit set of the polar code.

With reference to any one of the first aspect, or the first to the fourth possible implementation manners of the first aspect, in a fifth possible implementation manner of the first aspect, the polar code rate matching apparatus further includes a third determining unit, configured to determine, according to a redundancy version (RV) parameter, a sending bit transmitted in hybrid automatic repeat request HARQ retransmission.

With reference to any one of the first aspect, or the first to the fourth possible implementation manners of the first aspect, in a sixth possible implementation manner of the first aspect, the polar code rate matching apparatus further includes a third determining unit, configured to determine, from the interleaved output bits by means of sequential capturing or repetition, a sending bit that needs to be transmitted in HARQ retransmission.

According to a second aspect, a wireless communications device is provided. The device includes a memory, configured to store an instruction for performing the following operations determining, based on a Mersenne twister algorithm, a first sequence according to a code length of a target polar code, performing sorting processing on the first sequence according to a preset rule, to determine a second sequence, determining a mapping function according to the first sequence and the second sequence, and interleaving the target polar code according to the mapping function, to generate interleaved output bits, and a processor, coupled to the memory and configured to perform the instruction stored in the memory. With reference to the second aspect, in a first possible implementation manner of the second aspect, the memory is configured to store the following operation instruction determining the first sequence Z according to the following formulas:

$$X_{k+n} := X_{k+m} \oplus (X_k^{w-r} | X_{k+1}^r) A$$

$$V_k := X_{k+n} \oplus (X_{k+n} >> u)$$

$$H_k := V_k \oplus ((V_k << s) \& B)$$

$$Y_k := H_k \oplus ((H_k << t) \& C)$$

$$Z_k := Y_k \oplus (Y_k >> l)$$

where Z is the first sequence, V, H and Y are intermediate variables, $X_0, X_1, \ldots, X_{n-1}$ are n non-zero original integers, the non-zero original integer has w digits, $X_k^{w-r}|X_{k+1}^r$ represents an integer that has w digits and that is formed by sequentially splicing first (w−r) digits of $X_k$ and last r digits of $X_{k+1}$, $$A = \begin{pmatrix} & 1 & & & \\ & & 1 & & \\ & & & \ddots & \\ & & & & 1 \\ a_{w-1} & a_{w-2} & \ldots & \ldots & a_0 \end{pmatrix},$$

$a_{w-1}$, $a_{w-2}$, ... $a_0$ are specific parameters used for bit shifting, n, m, w, r, u, s, t, and l are specific positive integers, m is less than n, r is less than w, B and C are specific sequences, k is successively 0, 1, ..., N−1, and N is the code length of the target polar code.

With reference to the first possible implementation manner of the second aspect, in a second possible implementation manner of the second aspect, n=624, m=397, w=32, r=31, u=11, s=7, t=15, l=18, B=0x9d2c5680, and C=0xefc60000.

With reference to any one of the second aspect, or the first to the second possible implementation manners of the second aspect, in a third possible implementation manner of the second aspect, the memory is further configured to store the following operation instruction performing reversing processing on the interleaved output bits.

With reference to any one of the second aspect, or the first to the second possible implementation manners of the second aspect, in a fourth possible implementation manner of the second aspect, the memory is further configured to store the following operation instruction performing replacement processing on the interleaved output bits according to an information bit set of the polar code.

With reference to any one of the second aspect, or the first to the fourth possible implementation manners of the second aspect, in a fifth possible implementation manner of the second aspect, the memory is further configured to store the following operation instruction determining, according to a redundancy version RV parameter, a sending bit transmitted in hybrid automatic repeat request HARQ retransmission.

With reference to any one of the second aspect, or the first to the fourth possible implementation manners of the second aspect, in a sixth possible implementation manner of the second aspect, the memory is further configured to store the following operation instruction determining, from the interleaved output bits by means of sequential capturing or repetition, a sending bit that needs to be transmitted HARQ retransmission.

According to a third aspect, a polar code rate matching method is provided. The polar code rate matching method includes determining, based on a Mersenne twister algorithm, a first sequence according to a code length of a target polar code, performing sorting processing on the first sequence according to a preset rule, to determine a second sequence, determining a mapping function according to the first sequence and the second sequence, and interleaving the target polar code according to the mapping function, to generate interleaved output bits.

With reference to the third aspect, in a first possible implementation manner of the third aspect, the determining, based on a Mersenne twister algorithm, a first sequence according to a code length of a target polar code includes determining the first sequence Z according to the following formulas:

$$X_{k+n} := X_{k+m} \oplus (X_k^{w-r} | X_{k+1}^r) A$$

$$V_k := X_{k+n} \oplus (X_{k+n} >> u)$$

$$H_k := V_k \oplus ((V_k << s) \& B)$$

$$Y_k := H_k \oplus ((H_k << t) \& C)$$

$$Z_k := Y_k \oplus (Y_k >> l)$$

where Z is the first sequence, V, H and Y are intermediate variables, $X_0, X_1, \ldots, X_{n-1}$ are n non-zero original integers, the non-zero original integer has w digits, $X_k^{w-r} | X_{k+1}^r$ represents an integer that has w digits and that is formed by sequentially splicing first (w−r) digits of $X_k$ and last r digits of $X_{k+1}$, $$A = \begin{pmatrix} & 1 & & & \\ & & 1 & & \\ & & & \ddots & \\ & & & & 1 \\ a_{w-1} & a_{w-2} & \cdots & & a_0 \end{pmatrix},$$

$a_{w-1}, a_{w-2}, \ldots a_0$ are specific parameters used for bit shifting, n, m, w, r, u, s, t, and l are specific positive integers, m is less than n, r is less than w, B and C are specific sequences, k is successively $0, 1, \ldots, N-1$, and N is the code length of the target polar code.

With reference to the first possible implementation manner of the third aspect, in a second possible implementation manner of the third aspect, n=624, m=397, w=32, r=31, u=11, s=7, t=15, l=18, B=0x9d2c5680, and C=0xefc60000.

With reference to any one of the third aspect, or the first to the second possible implementation manners of the third aspect, in a third possible implementation manner of the third aspect, the polar code rate matching method further includes performing reversing processing on the interleaved output bits.

With reference to any one of the third aspect, or the first to the second possible implementation manners of the third aspect, in a fourth possible implementation manner of the third aspect, the polar code rate matching method further includes performing replacement processing on the interleaved output bits according to an information bit set of the polar code.

With reference to any one of the third aspect, or the first to the fourth possible implementation manners of the third aspect, in a fifth possible implementation manner of the third aspect, the polar code rate matching method further includes determining, according to a redundancy version RV parameter, a sending bit transmitted in hybrid automatic repeat request HARQ retransmission.

With reference to any one of the third aspect, or the first to the fourth possible implementation manners of the third aspect, in a sixth possible implementation manner of the third aspect, the polar code rate matching method further includes determining, from the interleaved output bits by means of sequential capturing or repetition, a sending bit that needs to be transmitted in HARQ retransmission.

According to a fourth aspect, a wireless communications system is provided, including an access terminal and a base station. The access terminal and/or the base station includes the polar code rate matching apparatus described in the embodiments of the present disclosure.

Based on the foregoing technical solutions, according to the polar code rate matching method and apparatus and the wireless communications device that are in the embodiments of the present disclosure, a first sequence is determined based on a Mersenne twister algorithm and according to a code length of a target polar code, a mapping function is determined by performing sorting on the first sequence, and rate matching for the target polar code is implemented based on the mapping function. Therefore, a bit sequence obtained from the rate matching can be more even in structure, a frame error rate of a punctured polar code can be reduced, HARQ performance can be improved, and further, communication reliability can be improved. In addition, the polar code rate matching method and apparatus and the wireless communications device can be applicable to a rate matching process for polar codes of various code lengths, and have high universality and practicability.

BRIEF DESCRIPTION OF DRAWINGS

To describe the technical solutions in the embodiments of the present disclosure more clearly, the following briefly describes the accompanying drawings required for describing the embodiments of the present disclosure Apparently, the accompanying drawings in the following description show merely some embodiments of the present disclosure, and a person of ordinary skill in the art may still derive other drawings from these accompanying drawings without creative efforts.

DESCRIPTION OF EMBODIMENTS

Figure 1:
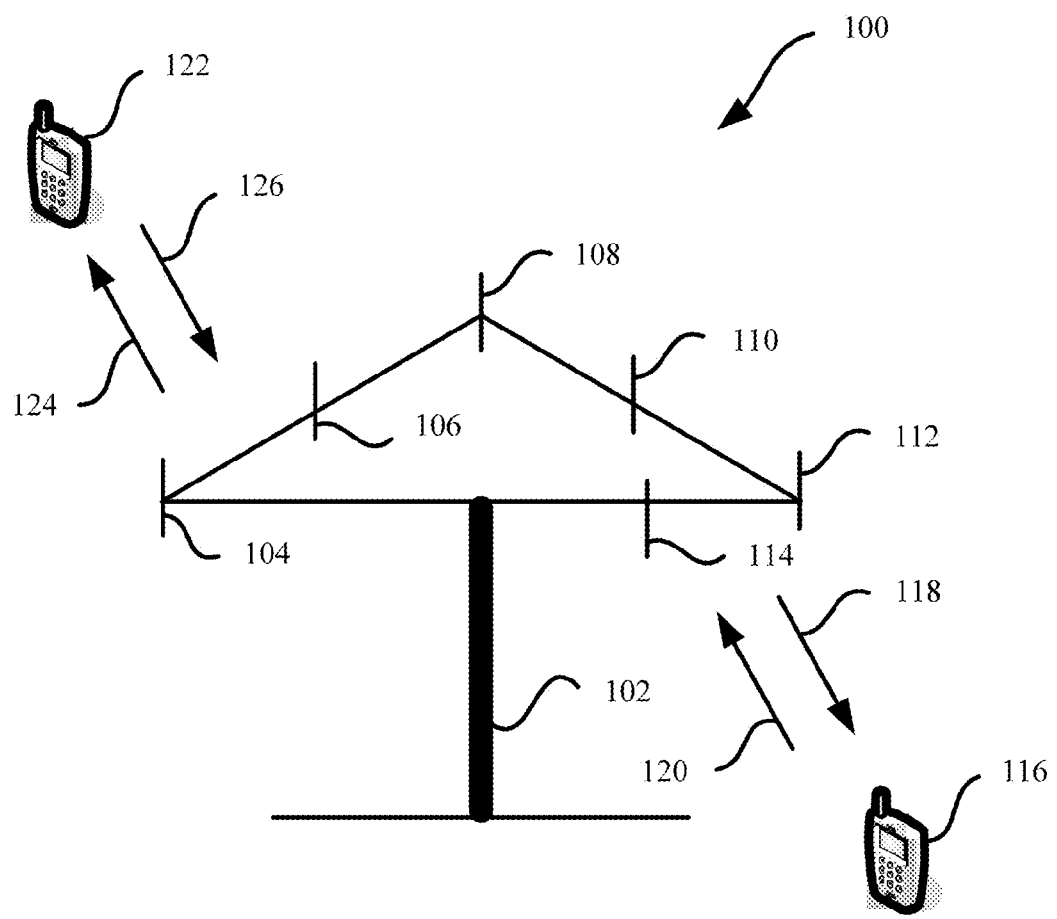
FIG. 1 is a schematic diagram of a wireless communications system according to embodiments of the present disclosure.

Multiple embodiments are described with reference to the accompanying drawings, and same components in this specification are indicated by a same reference numeral. In the following description, for ease of explanation, many specific details are provided to facilitate comprehensive understanding of one or more embodiments. However, the embodiments may not be implemented using these specific details either. In other examples, a well-known structure and device are shown in a form of block diagrams, to conveniently describe one or more embodiments.

Terms such as "component", "module", and "system" used in this specification are used to indicate an entity, hardware, firmware, a combination of hardware and software, software, or software in execution related to a computer. For example, a component may be, but is not limited to, a process that runs on a processor, a processor, an object, an executable file, a thread of execution, a program, and/or a computer. As shown in figures, both a computing device and an application that runs on a computing device may be components. One or more components may reside within a process and/or a thread of execution, and a component may be located on one computer and/or distributed between two or more computers. In addition, these components may be executed from various computer-readable media that store various data structures. For example, the components may communicate using a local and/or remote process and according to, for example, a signal having one or more data packets (for example, data from one component interacting with another component in a local system, a distributed system, and/or across a network such as the Internet interacting with other systems using the signal).

In addition, an access terminal is described in the embodiments. The access terminal may be referred to as a system, a subscriber unit, a subscriber station, a mobile station, a mobile, a remote station, a remote terminal, a mobile device, a user terminal, a terminal, a wireless communications device, a user agent, a user apparatus, or User Equipment (UE). The access terminal may be a cellular phone, a cordless phone, a Session Initiation Protocol (SIP) phone, a Wireless Local Loop (WLL) station, a Personal Digital Assistant (PDA), a handheld device having a wireless communication function, a computing device, or another processing device connected to a wireless modem. In addition, the embodiments are described with reference to a base station. The base station may be used to communicate with a mobile device, and the base station may be a Base Transceiver Station (BTS) in Global System for Mobile communication (GSM) or Code Division Multiple Access (CDMA), or may be a NodeB (NB) in Wideband Code Division Multiple Access WCDMA) or may be an evolved Node B (eNB or eNodeB) in Long Term Evolution (LTE), a relay station or an access point, a base station device in a future fifth generation (5G) network, or the like.

In addition, aspects or features of the present disclosure may be implemented as a method, an apparatus or a product that uses standard programming and/or engineering technologies. The term "product" used in this application covers a computer program that can be accessed from any computer-readable component, carrier or medium. For example, the computer-readable medium may include but not be limited to a magnetic storage component (for example, a hard disk, a floppy disk or a magnetic tape), an optical disc (for example, a Compact Disk (CD), or a Digital Versatile Disk (DVD), a smart card, and a flash memory component (for example, an Erasable Programmable Read-Only Memory (EPROM), a card, a stick, or a key drive). In addition, various storage media described in this specification may indicate one or more devices and/or other machine-readable media that is used to store information. The term "machine-readable media" may include but be not limited to a radio channel, and various other media that can store, contain, and/or carry an instruction and/or data.

FIG. 1 shows a wireless communications system 100 according to embodiments described in this specification. The wireless communications system 100 includes a base station 102, and the base station 102 may include multiple antenna groups. Each antenna group may include one or more antennas. For example, an antenna group may include antennas 104 and 106, another antenna group may include antennas 108 and 110, and an additional group may include antennas 112 and 114. In FIG. 1, two antennas are shown for each antenna group, but more or fewer antennas may be used for each group. The base station 102 may additionally include a transmitter chain and a receiver chain. A person of ordinary skill in the art may understand that the transmitter chain and the receiver chain may each include multiple components (such as a processor, a modulator, a multiplexer, a demodulator, a demultiplexer, or an antenna) that are related to signal sending and receiving.

The base station 102 may communicate with one or more access terminals (for example, an access terminal 116 and an access terminal 122). However, it may be understood that the base station 102 may communicate with any quantity of access terminals similar to the access terminal 116 or the access terminal 122. The access terminal 116 and the access terminal 122 may be, for example, a cellular phone, a smartphone, a portable computer, a handheld communications device, a handheld computing device, a satellite radio apparatus, a Global Positioning System, a PDA, and/or any another proper device used to perform communication in the wireless communications system 100. As shown in FIG. 1, the access terminal 116 communicates with the antennas 112 and 114, and the antennas 112 and 114 send information to the access terminal 116 using a forward link 118, and receive information from the access terminal 116 using a reverse link 120. In addition, the access terminal 122 communicates with the antennas 104 and 106, and the antennas 104 and 106 send information to the access terminal 122 using a forward link 124, and receive information from the access terminal 122 using a reverse link 126. In a Frequency Division Duplex (FDD) system, for example, the forward link 118 may use a frequency band different from that used by the reverse link 120, and the forward link 124 may use a frequency band different from that used by the reverse link 126. In addition, in a Time Division Duplex (TDD) system, the forward link 118 and the reverse link 120 may use a same frequency band, and the forward link 124 and the reverse link 126 may use a same frequency band.

Each antenna group and/or area designed for communication is referred to as a sector of the base station 102. For example, an antenna group may be designed for communicating with an access terminal in a sector of a coverage area of the base station 102. In a process in which the base station 102 communicates with the access terminals 116 and 122 respectively using the forward links 118 and 124, a transmit antenna of the base station 102 may use beamforming to improve signal to noise ratios of the forward links 118 and 124. In addition, in comparison with a manner in which a base station sends signals to all access terminals of the base station using a single antenna, less interference is caused to a mobile device in a neighboring cell when the base station 102 sends, by means of beamforming, signals to the access terminals 116 and 122 that are randomly distributed in a related coverage area.

In a given time, the base station 102, the access terminal 116, or the access terminal 122 may be a wireless communications sending apparatus and/or a wireless communications receiving apparatus. When sending data, the wireless communications sending apparatus may encode the data for transmission. In an embodiment, the wireless communications sending apparatus may obtain (for example, generate, receive from another communications apparatus, or save in a memory) a specific quantity of data bits that are to be sent to the wireless communications receiving apparatus through a channel. The data bits may be included in a data transmission block (or multiple transmission blocks), and the transmission block may be segmented to generate multiple code blocks. In addition, the wireless communications sending apparatus may encode each code block using a polar code encoder (not shown).

Figure 2:
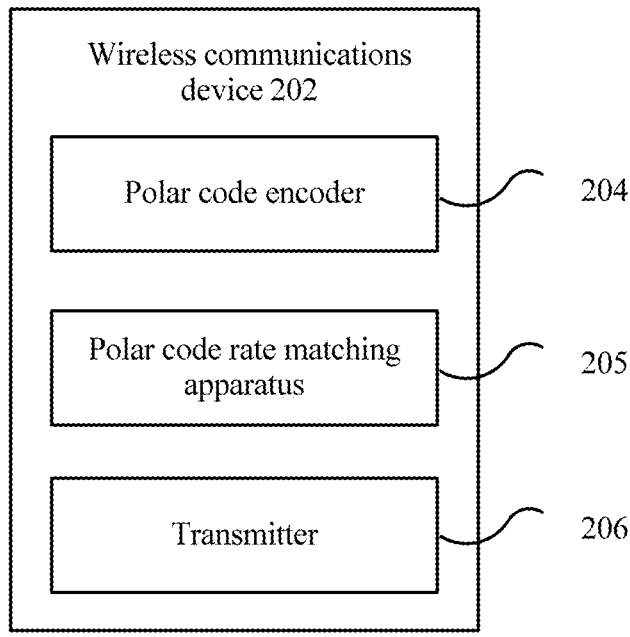
FIG. 2 is a schematic diagram of a system that performs a polar code rate matching method in an implementation manner of the present disclosure in a wireless communications environment.

FIG. 2 is a schematic block diagram of a system 200 applicable to a polar code rate matching method in the present disclosure in a wireless communications environment. The system 200 includes a wireless communications device 202, and the wireless communications device 202 sends data through a channel. Although it shows that the wireless communications device 202 sends data, the wireless communications device 202 may further receive data through a channel (for example, the wireless communications device 202 may send and receive data at the same time, the wireless communications device 202 may send and receive data at different moments, or a combination thereof). The wireless communications device 202 may be, for example, a base station (for example, the base station 102 in FIG. 1), or an access terminal (for example, the access terminal 116 or the access terminal 122 in FIG. 1).

The wireless communications device 202 may include a polar code encoder 204, a polar code rate matching apparatus 205, and a transmitter 206. Optionally, the wireless communications device 202 may further include a receiver when the wireless communications device 202 receives data through a channel. The receiver may exist independently, or may be integrated with the transmitter 206 to form a transceiver.

The polar code encoder 204 is configured to encode data to be transferred from the wireless communications device 202, to obtain a target polar code.

The polar code rate matching apparatus 205 is configured to determine, based on a Mersenne twister algorithm, a first sequence according to a code length of the target polar code output by the polar code encoder 204, perform sorting processing on the first sequence according to a preset rule, to determine a second sequence, determine a mapping function according to the first sequence and the second sequence, and interleave the target polar code according to the mapping function, to generate interleaved output bits.

In addition, the transmitter 206 may subsequently transfer, on a channel, the output bits that are performed by the polar code rate matching apparatus 205 and on which rate matching is performed. For example, the transmitter 206 may send related data to another wireless communications apparatus (not shown).

In the following, a polar code rate matching apparatus according to an embodiment of the present disclosure is described in detail with reference to FIG. 3.

Figure 3:
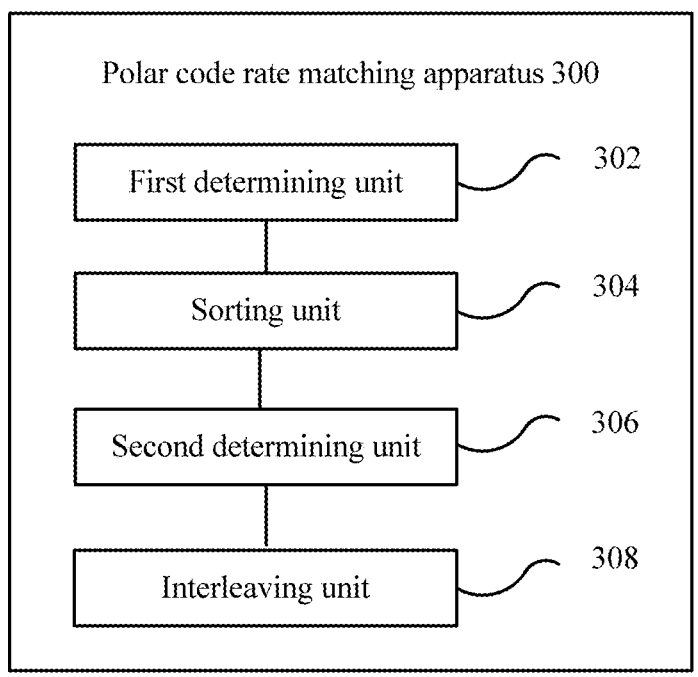
FIG. 3 is a schematic block diagram of a polar code rate matching apparatus according to an embodiment of the present disclosure.

FIG. 3 is a schematic block diagram of a polar code rate matching apparatus 300 according to an embodiment of the present disclosure. The polar code rate matching apparatus 300 in FIG. 3 includes a first determining unit 302, configured to determine, based on a Mersenne twister algorithm, a first sequence according to a code length of a target polar code, sorting unit 304, configured to perform, according to a preset rule, sorting processing on the first sequence determined by the first determining unit 302, to determine a second sequence, a second determining unit 306, configured to determine a mapping function according to the first sequence determined by the first determining unit 302 and the second sequence determined by the sorting unit 304, and an interleaving unit 308, configured to interleave the target polar code according to the mapping function determined by the second determining unit 306, to generate interleaved output bits.

In an embodiment, a transmit end may perform, using a polar code encoder or the like, polar code encoding processing on information that needs to be sent to a receive end to generate a polar code (that is, the target polar code). The polar code is a linear block code, and has been theoretically proved to be an encoding manner that can achieve a Shannon capacity and has low coding-decoding complexity. Encoding output of the polar code may be expressed as:

$$x_1^N = u_1^N G_N.$$

where $u_1^N = \{u_1, u_2, \ldots u_N\}$ is a binary row vector of a length N, $G_N$ is an N×N matrix, $G_N = B_N F^{\otimes n}$, a code length N=2, and n≥0, $$F = \begin{bmatrix} 1 & 0 \\ 1 & 1 \end{bmatrix},$$

$B_N$ is a transposed matrix, and $F^{\otimes n}$ is a Kronecker power (Kronecker power) and is defined as $F^{\otimes n} = F \otimes F^{\otimes(n-1)}$.

In a polar code encoding process, some bits in $u_1^N$ are used to carry information (that is, data information that needs to be sent to the receive end). These bits are referred to as information bits, and an index set of these bits is denoted as A. Remaining bits have fixed values, and are referred to as frozen bits. For example, the frozen bits may be usually set to 0.

Therefore, a polar code bit sequence output after encoding processing of the polar code encoder may be simplified as $x_1^N = u_A G_N(A)$, where $u_A$ is an information bit set of $u_1^N$, $u_A$ is a row vector of a length K, and K is a quantity of information bits. $G_N(A)$ is a submatrix obtained from a row that is in $G_N$ and that is corresponding to an index in the set A, and $G_N(A)$ is a K×N matrix. Selection of the set A determines performance of the polar code.

It should be understood that the polar code obtaining process enumerated above is merely an example, and the present disclosure is not limited thereto. Another method of performing encoding processing on information to obtain a bit sequence with a polar code feature falls within the protection scope of the present disclosure.

Then the first determining unit 302 may determine, based on the Mersenne twister algorithm, the first sequence according to the code length of the determined polar code.

Optionally, the first determining unit 302 is configured to determine the first sequence Z according to the following formulas $$X_{k+n}' := X_{k+m} \oplus (X_k^{w-r} | X_{k+1}^r) A \qquad (4)$$

$$V_k' := X_{k+n} \oplus (X_{k+n} >> u) \qquad (5)$$

$$H_k' := V_k \oplus ((V_k << s) \& B) \qquad (6)$$

$$Y_k' := H_k \oplus ((H_k << t) \& C) \qquad (7)$$

$$Z_k' := Y_k \oplus (Y_k >> l) \qquad (8)$$

where Z is the first sequence, V, H and Y are intermediate variables, $X_0, X_1, X_{n-1}$ are n non-zero original integers, the non-zero original integer has w digits, $X_k^{w-r}|X_{k+1}^r$ represents an integer that has w digits and that is formed by sequentially splicing first (w−r) digits of $X_k$ and last r digits of $X_{k+1}$, $$A = \begin{pmatrix} & 1 & & & \\ & & 1 & & \\ & & & \ddots & \\ & & & & 1 \\ a_{w-1} & a_{w-2} & \cdots & \cdots & a_0 \end{pmatrix},$$

$a_{w-1}, a_{w-2}, \ldots a_0$ are specific parameters used for bit shifting, n, m, w, r, u, s, t, and l are specific positive integers, m is less than n, r is less than w, B and C are specific sequences, k is successively 0, 1, . . . , N−1, and N is the code length of the target polar code.

In an embodiment, the foregoing formulas are formulas based on the Mersenne twister algorithm. The first determining unit 302 firstly gives the n non-zero original integers $X_0, X_1, \ldots, X_{n-1}$, where the non-zero original integer has w digits. A value of k is separately 0, 1, . . . , N−1 based on these non-zero initial integers such that $X_n, X_{n+1}, \ldots, X_{n+N-1}$ may be obtained. $X_k^{w-r}|X_{k+1}^r$ represents a new integer D that has w digits and that is formed by sequentially splicing the first (w−r) digits of $X_k$ and the last r digits of $X_{k+1}$. A result of DA (D×A) may be expressed as the following formulas (9) to (11)

$$DA = \begin{cases} shiftright(D) & \text{if } d_0 = 0 \\ shiftright(D) \oplus a & \text{if } d_0 = 1 \end{cases} \quad (9)$$

$$a = (a_{w-1}, a_{w-2}, \cdots, a_0) \quad (10)$$

$$D = (d_{w-1}, d_{w-2}, \cdots, d_0) \quad (11)$$

The first determining unit 302 may obtain $X_{n+k}$ according to the formula (4), and then perform a series of shifting and modular addition operations (formulas (5) to (8)) on the obtained $X_{n+k}$ to further homogenize and randomize the obtained sequence. $Z_1, Z_2, \ldots Z_N$ may be obtained by performing an iterative calculation for N times according to formulas (4) to (8), and $Z_1, Z_2, \ldots Z_N$ form the first sequence of the code length N.

Optionally, in this embodiment of the present disclosure, n=624, m=397, w=32, r=31, u=11, s=7, t=15, l=18, B=0x9d2c5680, and C=0xefc60000.

In an embodiment, through experiments, it is found that the first digit of the 32 digits may be obtained using a mask template UPPER_MASK (UPPER_MASK=0x80000000) and last 31 digits of the 32 digits may be obtained using a mask template LOWER_MASK (LOWER_MASK=0x7fffffff). When B=0x9d2c5680 and C=0xefc60000, the first sequence may have a better probability statistics characteristic, and randomness of the first sequence can be improved.

Then the sorting unit 304 may perform sorting processing on the determined first sequence in ascending order (an example of the preset rule). In this embodiment of the present disclosure, for example, a sort function may be used for the sorting processing, and the sort function may be expressed as sort (G), that is, elements in G are sorted in ascending order.

Therefore, in this embodiment of the present disclosure, sorting may be performed on the generated first sequence based on matlab using the following program: [ign,q]=sort (G), where G is the first sequence of the length N, and q is a mapping function of an interleaver.

Therefore, the first sequence resulting from the sorting processing may be used as the second sequence.

In should be understood that the preset rule in this embodiment of the present disclosure may further be sorting elements in descending order, sorting some elements in ascending order and sorting the other elements in descending order, or the like. This is not limited in this embodiment of the present disclosure.

Therefore, the second determining unit 306 determines the mapping function according to the first sequence obtained by the first determining unit 302 and the second sequence obtained by the sorting unit 304. In an embodiment, because the sorting unit 304 sorts elements in the first sequence, the mapping function may be determined according to positions of each element in the first sequence and in the second sequence. That is, the mapping function is a function that indicates a mapping relationship between the positions of each element in the first sequence and in the second sequence.

As an example instead of a limitation, if a sequence E is [0, 7, 1], a sequence F obtained after performing sorting processing on the sequence E in ascending order is [0, 1, 7]. Therefore, a mapping rule (or a mapping function) q from the sequence E to the sequence F may be expressed as [0, 2, 1]. That is, the first element (whose sequence number is 0) in the sequence F is the first element (whose sequence number is 0) in the sequence E, the second element (whose sequence number is 1) in the sequence F is the third element (whose sequence number is 2) in the sequence E, and the third element (whose sequence number is 2) in the sequence F is the second element (whose sequence number is 1) in the sequence E.

Likewise, the second determining unit 306 may obtain the mapping function according to the obtained second sequence and the first sequence.

Therefore, the interleaving unit 308 may interleave, based on the obtained mapping function, the target polar code determined by the first determining unit 302.

As an example instead of a limitation, if the mapping function q is [0, 2, 1], a bit value of the first bit (whose sequence number is 0) in a sequence of the interleaved bits is a bit value of the first bit (whose sequence number is 0) in the bit sequence before the interleaving processing, a bit value of the second bit (whose sequence number is 1) in the sequence of the interleaved bits is a bit value of the third bit (whose sequence number is 2) in the bit sequence before the interleaving processing, and a bit value of the third bit (whose sequence number is 2) in the sequence of the interleaved bits is a bit value of the second bit (whose sequence number is 1) in the bit sequence before the interleaving processing.

Optionally, the polar code rate matching apparatus 300 further includes a reversing unit, configured to perform reversing processing on the interleaved output bits.

In an embodiment, after the interleaving unit 308 obtains a sequence of the interleaved output bits, the reversing unit may perform the reversing processing on the bit sequence. For example, if the interleaved bits are expressed as $\{a_0, a_1, \ldots, a_{N-1}\}$, reversed bits may be expressed as $\{a_{N-1}, a_{N-2}, \ldots, a_1, a_0\}$.

Optionally, the polar code rate matching apparatus 300 further includes a replacement unit, configured to perform replacement processing on the interleaved output bits according to an information bit set of the polar code.

In an embodiment, the replacement unit may perform the replacement processing on a sequence of the interleaved bits after the interleaving unit 308 obtains the sequence of the interleaved output bits. The replacement processing in this embodiment of the present disclosure may be exchanging positions of some elements in the bit sequence with positions of other elements, or may be replacing an element with another element. This is not limited in this embodiment of the present disclosure. After the replacement unit performs the replacement processing, a set of zero-capacity bit channels of a punctured polar code with (N−K) punctured bits may be equal to a set of frozen bits. In this way, performance of the punctured polar code can be further improved.

It should be understood that, in this embodiment of the present disclosure, a replacement unit may be used for replacement processing and a reversing unit may further be used for reversing processing, and a sequence of performing the replacement processing and performing the reversing processing is not limited. Alternatively, only a replacement unit is used for replacement processing, or only a reversing unit is used for reversing processing. This is not limited in this embodiment of the present disclosure.

Optionally, the polar code rate matching apparatus 300 further includes a third determining unit, configured to determine, according to a redundancy version RV parameter, a sending bit transmitted in HARQ retransmission. In an embodiment, after the interleaving processing (or the interleaving and reversing processing, or the interleaving and replacement processing, or the interleaving, reversing, and replacement processing), the third determining unit may send the output bits to a circular buffer, and determine a start position of the current transmitted bit in the circular buffer according to a Redundancy Version parameter corresponding to a current HARQ transmission. In addition, a length of the current transmitted bit may be determined according to a transmission resource or a preset rule. Therefore, the sending bit that needs to be transmitted in the current HARQ transmission, that is, an output bit of rate matching processing, may be determined. That is, the third determining unit determines, according to the redundancy version RV parameter, the start position and the bit length that are of the sending bit in the interleaved output bits to determine the sending bit.

Optionally, the polar code rate matching apparatus 300 further includes a third determining unit, configured to determine, from the interleaved output bits by means of sequential capturing or repetition, a sending bit that needs to be transmitted in HARQ retransmission.

In an embodiment, the third determining unit may determine, according to a transmission resource or a preset rule and using a counter, a circular buffer, or the like, a start position that is of a bit transmitted in each time of HARQ retransmission and that is in the output bits obtained from the interleaving processing (or the interleaving and reversing processing, or the interleaving and replacement processing, or the interleaving, reversing, and replacement processing). Therefore, the third determining unit may determine a bit in each time of retransmission in a manner of sequential capturing or repetition.

The polar code rate matching apparatus 300 in this embodiment of the present disclosure may be correspondingly to an execution body of a polar code rate matching method 800 in the following embodiment of the present disclosure. Units of the polar code rate matching apparatus 300 and the foregoing other operations and/or functions are separately for implementing corresponding procedures of the method 800 in FIG. 8. For brevity, details are not described herein.

Therefore, according to the polar code rate matching apparatus in this embodiment of the present disclosure, a first sequence is determined based on a Mersenne twister algorithm and according to a code length of a target polar code, a mapping function is determined by performing sorting on the first sequence, and rate matching for the target polar code is implemented based on the mapping function. Therefore, a bit sequence obtained from the rate matching can be more even in structure, a frame error rate of a punctured polar code can be reduced, HARQ performance can be improved, and further, communication reliability can be improved. In addition, the polar code rate matching apparatus can be applicable to a rate matching process for polar codes of various code lengths, and has high universality and practicability.

Figure 4:
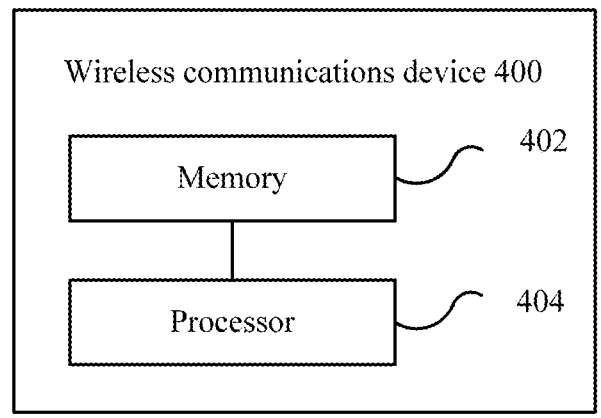
FIG. 4 is a schematic block diagram of a wireless communications device according to an embodiment of the present disclosure.

FIG. 4 is a schematic diagram of a wireless communications device 400 that performs the polar code processing method in a wireless communications system. The wireless communications device 400 includes a memory 402 and a processor 404. The memory 402 is configured to store an instruction for performing the following operations determining, based on a Mersenne twister algorithm, a first sequence according to a code length of a target polar code, performing sorting processing on the first sequence according to a preset rule, to determine a second sequence, determining a mapping function according to the first sequence and the second sequence, and interleaving the target polar code according to the mapping function, to generate interleaved output bits. The processor 404 is coupled to the memory and is configured to perform the instruction stored in the memory.

Optionally, in an embodiment, the memory 402 may be configured to store the following operation instruction determining the first sequence Z according to the following formulas:

$$X_{k+n}' = X_{k+m} \oplus (X_k^{w-r} | X_{k+1}^r) A$$

$$V_k' = X_{k+n} \oplus (X_{k+n} >> u)$$

$$H_k' = V_k \oplus ((V_k << s) \& B)$$

$$Y_k' = H_k \oplus ((H_k << t) \& C)$$

$$Z_k' = Y_k \oplus (Y_k >> l)$$

where Z is the first sequence, V, H and Y are intermediate variables, $X_0, X_1, \ldots, X_{n-1}$ are n non-zero original integers, the non-zero original integer has w digits, $X_k^{w-r} | X_{k+1}^r$ represents an integer that has w digits and that is formed by sequentially splicing first (w−r) digits of $X_k$ and last r digits of $X_{k+1}$, $$A = \begin{pmatrix} & & & 1 & \\ & & & & 1 \\ & & & \ddots & \\ & & & & 1 \\ a_{w-1} & a_{w-2} & \ldots & \ldots & a_0 \end{pmatrix},$$

$a_{w-1}, a_{w-2}, \ldots a_0$ are specific parameters used for bit shifting, n, m, w, r, u, s, t, and l are specific positive integers, m is less than n, r is less than w, B and C are specific sequences, k is successively 0, 1, ..., N−1, and N is the code length of the target polar code.

Optionally, in an embodiment, n=624, m=397, w=32, r=31 u=11, s=7, t=15, l=18, B=0x9d2c5680, and C=0xefc60000.

Optionally, in an embodiment, the processor 402 is further configured to store the following operation instruction performing reversing processing on the interleaved output bits. Optionally, in an embodiment, the processor 402 is further configured to store the following operation instruction performing replacement processing on the interleaved output bits according to an information bit set of the polar code. Optionally, in an embodiment, the processor 402 is further configured to store the following operation instruction: determining, according to a redundancy version RV parameter, a sending bit transmitted in hybrid automatic repeat request HARQ retransmission. Optionally, in an embodiment, the processor 402 is further configured to store the following operation instruction: determining, from the interleaved output bits by means of sequential capturing or repetition, a sending bit that needs to be transmitted in HARQ retransmission.

The wireless communications device 400 in this embodiment of the present disclosure may be corresponding to an execution body of a polar code rate matching method 800 in the following embodiment of the present disclosure. Units of the wireless communications device 400 and the foregoing other operations and/or functions are separated for implementing corresponding procedures of the method 800 in FIG. 8. For brevity, details are not described herein.

Therefore, according to the wireless communications device in this embodiment of the present disclosure, a first sequence is determined based on a Mersenne twister algorithm and according to a code length of a target polar code, a mapping function is determined by performing sorting on the first sequence, and rate matching for the target polar code is implemented based on the mapping function. Therefore, a bit sequence obtained from the rate matching can be more even in structure, a frame error rate of a punctured polar code can be reduced, HARQ performance can be improved, and further, communication reliability can be improved. In addition, the wireless communications device can be applicable to a rate matching process for polar codes of various code lengths, and has high universality and practicability.

Figure 5:
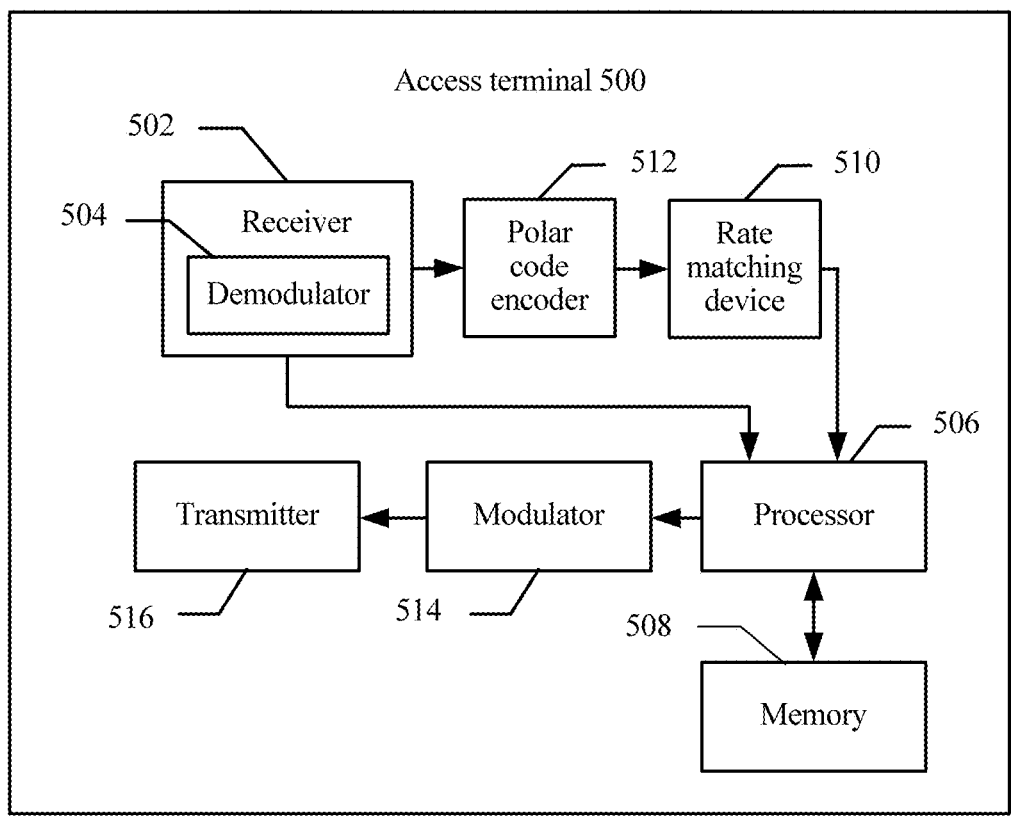
FIG. 5 is a schematic diagram of an access terminal that performs a polar code processing method according to an embodiment of the present disclosure.

FIG. 5 is a schematic diagram of an access terminal 500 that helps perform the polar code processing method in a wireless communications system. The access terminal 500 includes a receiver 502. The receiver 502 is configured to receive a signal from a receive antenna (not shown) or the like, perform a typical action (such as filtering, amplification, or down-conversion) on the received signal, and digitalize an adjusted signal to obtain a sample. The receiver 502 may be, for example, a Minimum Mean-Square Error (MMSE) receiver. The access terminal 500 may further include a demodulator 504. The demodulator 504 may be configured to demodulate the received signal and provide the signal for a processor 506 for channel estimation. The demodulator 504 may be integrated in the receiver 502, or may be an independent component in the access terminal 500. This is not limited in this embodiment of the present disclosure. The processor 506 may be a processor that is dedicatedly used to analyze information received by the receiver 502 and/or generate information that is to be sent by a transmitter 516, a processor used to control one or more components of the access terminal 500, and/or a controller used to analyze a signal received by the receiver 502, generate information that is to be sent by a transmitter 516, and control one or more components of the access terminal 500.

The access terminal 500 may additionally include a memory 508. The memory 508 is coupled to the processor 506 in an operable manner and stores the following data to-be-sent data, received data, and any other proper information related to execution of various actions and functions described in this specification. The memory 508 may additionally store a protocol and/or an algorithm that are/is related to polar code processing.

It may be understood that a data storage apparatus (such as the memory 508) described in this specification may be a volatile memory or a non-volatile memory, or may include both a volatile memory and a non-volatile memory. As an example instead of a limitation, the non-volatile memory may include a Read-Only Memory (ROM), a Programmable ROM (PROM), an EPROM, an electrically erasable programmable read-only memory (EEPROM), or a flash memory. The volatile memory may include a Random Access Memory (RAM) that is used as a high-speed external cache. According to description that is used as an example instead of a limitation, RAMs of many forms are available, such as a static random access memory, a dynamic random access memory (DRAM), a synchronous dynamic random access memory (SRAM), a double data rate synchronous dynamic random access memory (DDR SDRAM), an enhanced synchronous dynamic random access memory (ESDRAM), a synchlink dynamic random access memory (SLDRAM), and a direct rambus random access memory (DR RAM). A purpose of the memory 508 in the system and the method that are described in this specification is to include but is not limited to the foregoing memories and a memory of any other proper type.

In actual application, the receiver 502 may further be coupled to a rate matching device 510 that may be basically similar to the polar code rate matching apparatus 205 in FIG. 2. In addition, the access terminal 500 may include a polar code encoder 512 (a polar code encoder 512), and the polar code encoder 512 is basically similar to the polar code encoder 204 in FIG. 2. The rate matching device 510 may be configured to determine, based on a Mersenne twister algorithm, a first sequence according to a code length of a target polar code that is obtained after the polar code encoder 512 performs polar code encoding processing, perform sorting processing on the first sequence according to a preset rule, to determine a second sequence, determine a mapping function according to the first sequence and the second sequence, and interleave the target polar code according to the mapping function, to generate interleaved output bits.

Optionally, in an embodiment, the rate matching device 510 is further configured to determine the first sequence Z according to the following formulas:

$$X_{k+n} := X_{k+m} \oplus (X_k^{w-r} | X_{k+1}^r) A$$

$$V_k := X_{k+n} \oplus (X_{k+n} >> u)$$

$$H_k := V_k \oplus ((V_k << s) \& B)$$

$$Y_k := H_k \oplus ((H_k << t) \& C)$$

$$Z_k := Y_k \oplus (Y_k >> l)$$

where Z is the first sequence, V, H and Y are intermediate variables, $X_0, X_1, \ldots, X_{n-1}$ are n non-zero original integers, the non-zero original integer has w digits, $X_k^{w-r} | X_{k+1}^r$ represents an integer that has w digits and that is formed by sequentially splicing first (w−r) digits of $X_k$ and last r digits of $X_{k+1}$, $$A = \begin{pmatrix} 1 & & & & \\ & 1 & & & \\ & & \ddots & & \\ & & & 1 & \\ a_{w-1} & a_{w-2} & \ldots & \ldots & a_0 \end{pmatrix},$$

$a_{w-1}, a_{w-2}, \ldots a_0$ are specific parameters used for bit shifting, n, m, w, r, u, s, t, and l are specific positive integers, m is less than n, r is less than w, B and C are specific sequences, k is successively 0, 1, ..., N−1, and N is the code length of the target polar code.

Optionally, n=624, m=397, w=32, r=31, u=11, s=7, t=15, l=18, B=0x9d2c5680, and C=0xefc60000.

Optionally, in another embodiment, the rate matching device 510 is further configured to perform reversing processing on the interleaved output bits.

Optionally, in another embodiment, the rate matching device 510 is further configured to perform replacement processing on the interleaved output bits according to an information bit set of the polar code.

Optionally, in another embodiment, the rate matching device 510 is further configured to determine, according to a redundancy version RV parameter, a sending bit transmitted in hybrid automatic repeat request HARQ retransmission.

Optionally, in another embodiment, the rate matching device 510 is further configured to determine, from the interleaved output bits by means of sequential capturing or repetition, a sending bit that needs to be transmitted in HARQ retransmission.

In addition, the access terminal 500 may further include a modulator 514 and a transmitter 516. The transmitter 516 is configured to send a signal to a base station, another access terminal, or the like. Although it shows that the polar code encoder 512, the rate matching device 510, and/or the modulator 514 are/is separated from the processor 506, it may be understood that the polar code encoder 512, the rate matching device 510, and/or the modulator 514 may be a part of the processor 506 or multiple processors (not shown). In actual application, the receiver 502 and the transmitter 516 may be integrated to form a transceiver.

Therefore, according to the access terminal in this embodiment of the present disclosure, a first sequence is determined based on a Mersenne twister algorithm and according to a code length of a target polar code, a mapping function is determined by performing sorting on the first sequence, and rate matching for the target polar code is implemented based on the mapping function. Therefore, a bit sequence obtained from the rate matching can be more even in structure, a frame error rate of a punctured polar code can be reduced, HARQ performance can be improved, and further, communication reliability can be improved. In addition, the access terminal can be applicable to a rate matching process for polar codes of various code lengths, and has high universality and practicability.

An embodiment of the present disclosure further provides a wireless communications system that includes an access terminal and a base station. The access terminal and/or the base station includes the polar code rate matching apparatus in the foregoing embodiments. In the following, the wireless communications system is described in detail using a specific example.

Figure 6:
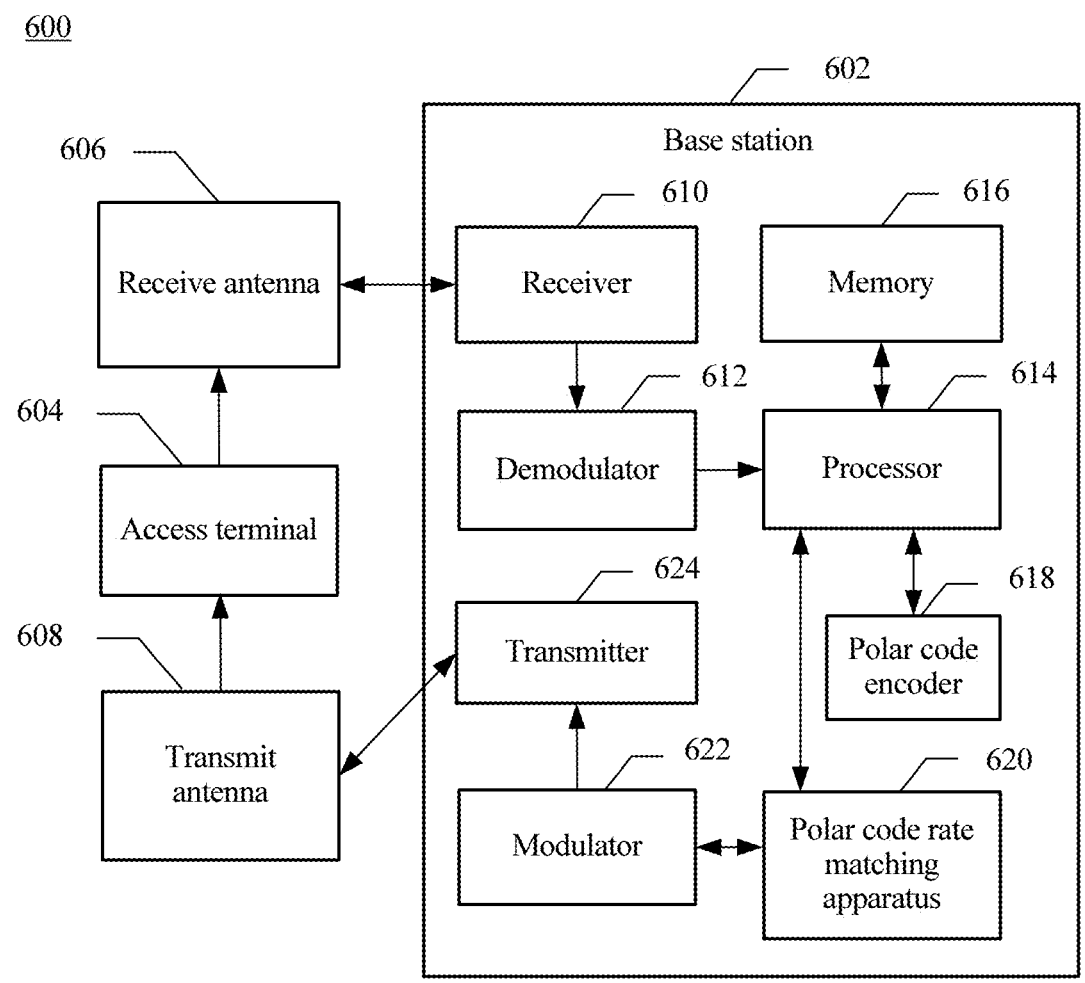
FIG. 6 is a schematic diagram of a system that performs a polar code processing method according to an embodiment of the present disclosure.

FIG. 6 is a schematic diagram of a system 600 that performs the polar code processing method in a wireless communications environment. The system 600 includes a base station 602 (such as an access point, an NB, or an eNB) and an access terminal 604. The base station 602 includes a receiver 610 that receives a signal from one or more access terminals 604 using multiple receive antennas 606, and a transmitter 624 that transmits a signal to the one or more access terminals 604 using a transmit antenna 608. Generally, a "receive antenna" and a "transmit antenna" can be integrated to form a transceiver antenna. The receiver 610 may receive information from the receive antenna 606, and may be associated, in an operable manner, with a demodulator 612 that demodulates received information. A demodulated symbol is analyzed using a processor 614. The processor 614 is connected to a memory 616, and the memory 616 is configured to store data to be sent to the access terminal 604 (or a different base station (not shown)), data received from the access terminal 604 (or a different base station (not shown)), and/or any other proper information related to execution of various actions and functions described in this specification. The processor 614 may further be coupled to a polar code encoder 618 and a polar code rate matching apparatus 620, and the polar code rate matching apparatus 620 may be configured to determine, based on a Mersenne twister algorithm, a first sequence according to a code length of a target polar code that is obtained after the polar code encoder 618 performs polar code encoding processing, perform sorting processing on the first sequence according to a preset rule, to determine a second sequence, determine a mapping function according to the first sequence and the second sequence, and interleave the target polar code according to the mapping function, to generate interleaved output bits.

Optionally, in an embodiment, the polar code rate matching apparatus 620 is further configured to determine the first sequence Z according to the following formulas:

$X_{k+n} := X_{k+n} \oplus (X_k^{w-r} | X_{k+1}^r) A$ $V_k := X_{k+n} \oplus (X_{k+n} >> u)$ $H_k := V_k \oplus ((V_k << s) \& B)$ $Y_k := H_k \oplus ((H_k << t) \& C)$ $Z_k := Y_k \oplus (Y_k >> l)$ where Z is the first sequence, V, H and Y are intermediate variables, $X_0, X_1, \ldots, X_{n-1}$ are n non-zero original integers, the non-zero original integer has w digits, $X_k^{w-r} | X_{k+1}^r$ represents an integer that has w digits and that is formed by sequentially splicing first (w−r) digits of $X_k$ and last r digits of $X_{k+1}$, $$A = \begin{pmatrix} 1 & & & & \\ & 1 & & & \\ & & \ddots & & \\ & & & 1 & \\ a_{w-1} & a_{w-2} & \ldots & \ldots & a_0 \end{pmatrix},$$

$a_{w-1}, a_{w-2}, \ldots a_0$ are specific parameters used for bit shifting, n, m, w, r, u, s, t, and l are specific positive integers, m is less than n, r is less than w, B and C are specific sequences, k is successively 0, 1, ..., N−1, and N is the code length of the target polar code.

Optionally, n=624, m=397, w=32, r=31, u=11, s=7, t=15, l=18, B=0x9d2c5680, and C=0xefc60000.

Optionally, in another embodiment, the polar code rate matching apparatus 620 is further configured to perform reversing processing on the interleaved output bits.

Optionally, in another embodiment, the polar code rate matching apparatus 620 is further configured to perform replacement processing on the interleaved output bits according to an information bit set of the polar code.

Optionally, in another embodiment, the polar code rate matching apparatus 620 is further configured to determine, according to a redundancy version RV parameter, a sending bit transmitted in hybrid automatic repeat request HARQ retransmission.

Optionally, in another embodiment, the polar code rate matching apparatus 620 is further configured to determine, from the interleaved output bits by means of sequential capturing or repetition, a sending bit that needs to be transmitted in HARQ retransmission.

In addition, in the system 600, a modulator 622 may modulate a frame. The transmitter 624 sends the frame modulated by the modulator 622 to the access terminal 604 using the antenna 606. Although it shows that the polar code encoder 618, the polar code rate matching apparatus 620, and/or the modulator 622 are/is separated from the processor 614, it may be understood that the polar code encoder 618, the polar code rate matching apparatus 620, and/or the modulator 622 may be a part of the processor 614 or multiple processors (not shown).

It may be understood that the embodiments described in this specification may be implemented by hardware, software, firmware, middleware, a microcode, or a combination thereof. For hardware implementation, a processing unit may be implemented in one or more Application-Specific Integrated Circuits (ASICs), DSPs Digital Signal Processors (DSPs), DSP Device (DVDS), Programmable Logic Devices (PLDs), Field-Programmable Gate Array (FPGAs), processors, controllers, microcontrollers, microprocessors, chips, or other electronic units or a combination thereof used to perform the functions described in this specification.

When the embodiments are implemented in software, firmware, middleware, a microcode, a program code, or a code segment, the software, firmware, middleware, microcode, program code, or code segment may be stored in, for example, a machine-readable medium of a storage component. The code segment may refer to a process, a function, a subprogram, a program, a routine, a subroutine, a module, a software group, a class, or any combination of an instruction, a data structure, or a program statement. The code segment may be coupled to another code segment or a hardware circuit by sending and/or receiving information, data, an independent variable, a parameter, or memory content. Information, an independent variable, a parameter, data, or the like may be transmitted, forwarded, or sent in any proper manner such as memory sharing, information transmission, token transmission, or network transmission.

For software implementation, the technology described in this specification may be implemented by a module (such as a process, or a function) that performs the functions described in this specification. A software program may be stored in a memory and executed by a processor. A memory unit may be implemented in a processor or outside a processor. If the memory unit is implemented outside a processor, the memory unit may be coupled to the processor in a communications manner using various methods known in the art.

Therefore, according to the system that performs the polar code processing method in this embodiment of the present disclosure, a first sequence is determined based on a Mersenne twister algorithm and according to a code length of a target polar code, a mapping function is determined by performing sorting on the first sequence, and rate matching for the target polar code is implemented based on the mapping function. Therefore, a bit sequence obtained from the rate matching can be more even in structure, a frame error rate of a punctured polar code can be reduced, HARQ performance can be improved, and further, communication reliability can be improved. In addition, the system can be applicable to a rate matching process for polar codes of various code lengths, and has high universality and practicability.

Figure 7:
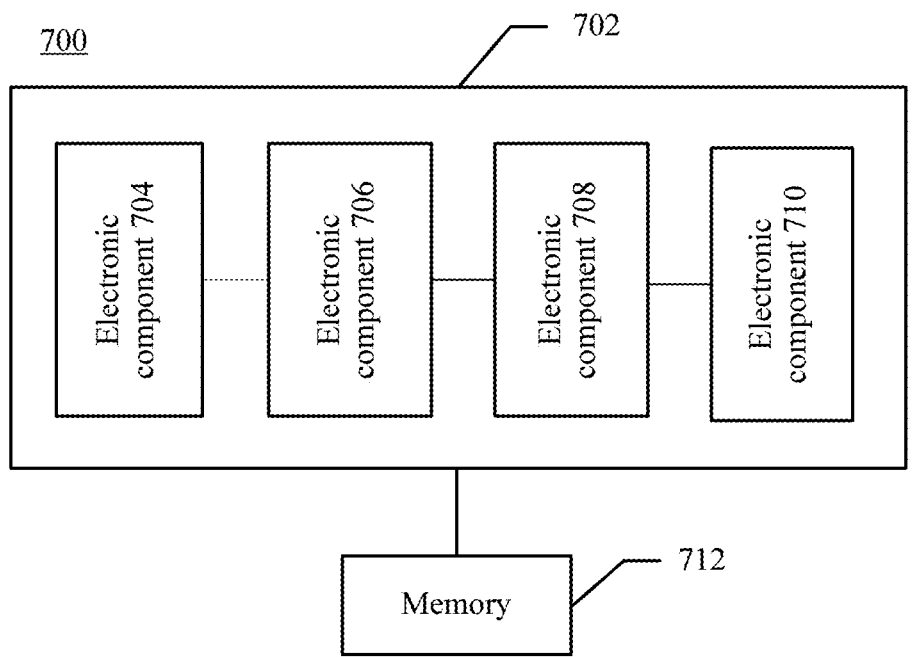
FIG. 7 is a schematic diagram of a system that uses a polar code rate matching method according to an embodiment of the present disclosure.

FIG. 7 shows a system 700 that can use the polar code rate matching method in a wireless communications environment. For example, at least a part of the system 700 may camp on a base station. For another example, at least a part of the system 700 may camp on an access terminal. It should be understood that the system 700 may be expressed as a functional block. The system 700 may be a functional block of a function implemented by a processor, software, or a combination (for example, firmware) thereof. The system 700 includes a logic group 702 including electronic components that perform a joint operation. For example, the logic group 702 may include an electronic component 704 that is configured to determine, based on a Mersenne twister algorithm, a first sequence according to a code length of a target polar code, an electronic component 706 that is configured to perform sorting processing on the first sequence according to a preset rule, to determine a second sequence, an electronic component 708 that is configured to determine a mapping function according to the first sequence and the second sequence, and an electronic component 710 that is configured to interleave the target polar code according to the mapping function, to generate interleaved output bits.

According to the foregoing solution, in the system in this embodiment of the present disclosure, a first sequence is determined according to a code length of a polar code, and a target polar code is interleaved using the first sequence. Therefore, a bit sequence obtained from the interleaving can be more even in structure, a frame error rate can be reduced, HARQ performance can be improved, and further, communication reliability can be improved. In addition, the system can be applicable to a rate matching process for polar codes of various code lengths, and has high universality and practicability.

In addition, the system 700 may include a memory 712. The memory 712 stores instructions used to perform functions related to the electronic components 704, 706, 708, and 710. Although it shows that the electronic components 704, 706, 708, and 710 are outside the memory 712, it may be understood that one or more of the electronic components 704, 706, 708, and 710 may be inside the memory 712.

The foregoing describes in detail the polar code rate matching apparatus according to the embodiments of the present disclosure with reference to FIG. 1 to FIG. 7. In the following, a specific processing process of the rate matching apparatus is described in detail.

Figure 8:
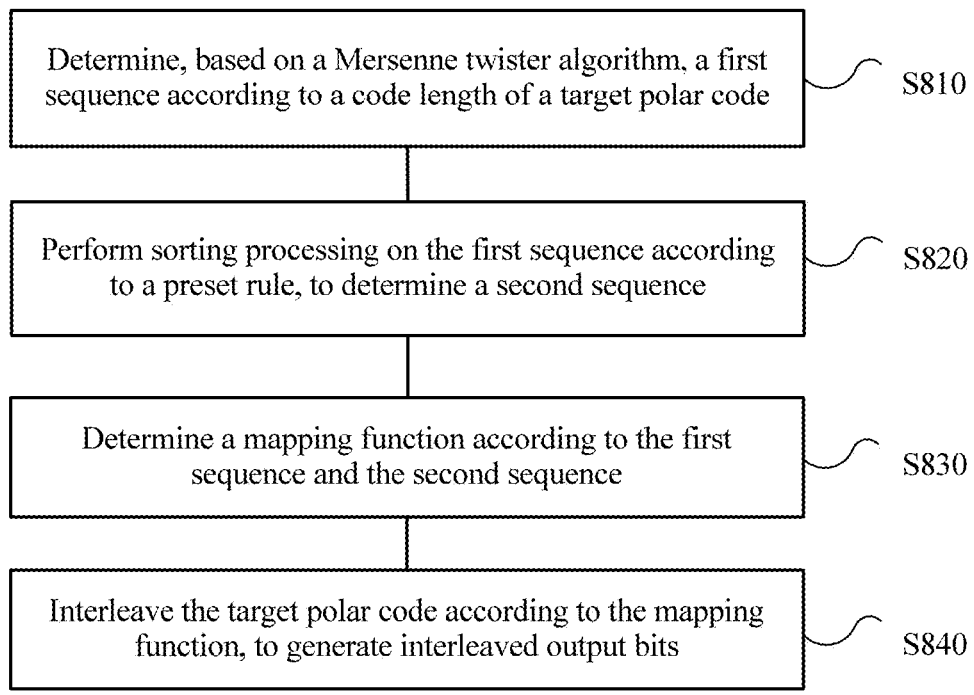
FIG. 8 is a schematic flowchart of a polar code rate matching method according to an embodiment of the present disclosure.

FIG. 8 is a schematic flowchart of a polar code rate matching method 800 according to an embodiment of the present disclosure. The polar code rate matching method 800 shown in FIG. 8 may be performed by a rate matching apparatus (for example, an interleaver) in a wireless communications device. The polar code rate matching method 800 includes:

S810: Determine, based on a Mersenne twister algorithm, a first sequence according to a code length of a target polar code.

S820: Perform sorting processing on the first sequence according to a preset rule, to determine a second sequence.

S830: Determine a mapping function according to the first sequence and the second sequence.

S840: Interleave the target polar code according to the mapping function, to generate interleaved output bits.

In an embodiment, in S810, a transmit end may perform, using a polar code encoder or the like, polar code encoding processing on information that needs to be sent to a receive end to generate a polar code (that is, the target polar code). The polar code is a linear block code, and has been theoretically proved to be an encoding manner that can achieve a Shannon capacity and has low coding-decoding complexity. Encoding output of the polar code may be expressed as $$x_1^N = u_1^N G_N$$

$u_1^N = \{u_1, u_2, \ldots, u_N\}$ is a binary row vector of a length N, $G_N$ is an N×N matrix, $G_N = B_N F^{\otimes n}$, a code length N=2, and n≥0, $$F = \begin{bmatrix} 1 & 0 \\ 1 & 1 \end{bmatrix}.$$

$B_N$ is a transposed matrix, and $F^{\otimes n}$ is a Kronecker power (Kronecker power) and is defined as $F^{\otimes n} = F \otimes F^{\otimes n}$.

In a polar code encoding process, some bits in $u_1^N$ are used to carry information (that is, data information that needs to be sent to the receive end). These bits are referred to as information bits, and an index set of these bits is denoted as A. Remaining bits have fixed values, and are referred to as frozen bits. For example, the frozen bits may be usually set to 0.

Therefore, a polar code bit sequence output after encoding processing of the polar code encoder may be simplified as $x_1^N = u_A G_N(A)$, where $u_A$ is an information bit set of $u_1^N$, $u_A$ is a row vector of a length K, and K is a quantity of information bits. $G_N(A)$ is a submatrix obtained from a row that is in $G_N$ and that is corresponding to an index in the set A, and $G_N(A)$ is a K×N matrix. Selection of the set A determines performance of the polar code.

It should be understood that the polar code obtaining process enumerated above is merely an example, and the present disclosure is not limited thereto. Another method of performing encoding processing on information to obtain a bit sequence with a polar code feature falls within the protection scope of the present disclosure.

Then, the first sequence is determined based on the Mersenne twister algorithm and according to the code length of the determined polar code.

Optionally, determining, based on a Mersenne twister algorithm, a first sequence according to a code length of a target polar code includes determining the first sequence Z according to the following formulas $$X_{k+n} := X_{k+m} \oplus (X_k^{w-r} | X_{k+1}^r) A$$

$$V_k := X_{k+n} \oplus (X_{k+n} >> u)$$

$$H_k := V_k \oplus ((V_k << s) \& B)$$

$$Y_k := H_k \oplus ((H_k << t) \& C)$$

$$Z_k := Y_k \oplus (Y_k >> l)$$

where Z is the first sequence, V, H and Y are intermediate variables, $X_0, X_1, \ldots, X_{n-1}$ are n non-zero original integers, the non-zero original integer has w digits, $X_k^{w-r} | X_{k+1}^r$ represents an integer that has w digits and that is formed by sequentially splicing first (w−r) digits of $X_k$ and last r digits of $X_{k+1}$, $$A = \begin{pmatrix} & & 1 & & \\ & & & 1 & \\ & & & & \ddots \\ & & & & & 1 \\ a_{w-1} & a_{w-2} & \ldots & \ldots & a_0 \end{pmatrix},$$

$a_{w-1}, a_{w-2}, \ldots a_0$ are specific parameters used for bit shifting, n, m, w, r, u, s, t, and l are specific positive integers, m is less than n, r is less than w, B and C are specific sequences, k is successively 0, 1, ..., N−1, and N is the code length of the target polar code.

In an embodiment, the foregoing formulas are formulas based on the Mersenne twister algorithm. First, the n non-zero original integers $X_0, X_1, \ldots, X_{n-1}$ are given, where the non-zero original integer has w digits, and k may separately be 0, 1, ..., N−1 based on these non-zero initial integers such that $X_n, X_{n+1}, \ldots, X_{n+N-1}$ may be obtained. $X_k^{w-r} | X_{k+1}^r$ represents a new integer D that has w digits and that is formed by sequentially splicing the first (w−r) digits of $X_k$ and the last r digits of $X_{k+1}$. A result of DA may be expressed as the following formulas:

$$DA = \begin{cases} shiftright(D) & \text{if } d_0 = 0 \\ shiftright(D) \oplus a & \text{if } d_0 = 1 \end{cases}$$

$$a = (a_{N-1}, a_{N-2}, \cdots, a_0)$$

$$D = (d_{N-1}, d_{N-2}, \cdots, d_0)$$

$X_{n+k}$ may be obtained according to the formula (4), and then a series of shifting and modular addition operations are performed on the obtained $X_{n+k}$ to further homogenize and randomize the obtained sequence. $Z_1, Z_2, \ldots Z_N$ may be obtained by performing an iterative calculation for N times according to the formulas, and $Z_1, Z_2, \ldots Z_N$ form the first sequence of the code length N.

Optionally, in this embodiment of the present disclosure, n=624, m=397, w=32, r=31, u=11, s=7, t=15, l=18, B=0x9d2c5680, and C=0xefc60000.

In an embodiment, through experiments, it is found that the first digit of the 32 digits may be obtained using a mask template UPPER_MASK (UPPER_MASK=0x80000000), and last 31 digits of the 32 digits may be obtained using a mask template LOWER_MASK (LOWER_MASK=0x7fffffff). When B=0x9d2c5680 and C=0xefc60000, the first sequence may have a better probability statistics characteristic, and randomness of the first sequence can be improved.

Then, in S820, the transmit end may perform sorting processing on the determined first sequence in ascending order (an example of the preset rule). In this embodiment of the present disclosure, for example, a sort function may be used for the sorting processing, and the sort function may be expressed as sort (G), that is, elements in G are sorted in ascending order.

Therefore, in this embodiment of the present disclosure, sorting may be performed on the generated first sequence based on matlab using the following program: [ign,q]=soft (G), where G is the first sequence of the length N, and q is a mapping function of an interleaver.

Therefore, the first sequence resulting from the sorting processing may be used as the second sequence.

In should be understood that the preset rule in this embodiment of the present disclosure may further be sorting elements in descending order, sorting some elements in ascending order and sorting the other elements in descending order, or the like. This is not limited in this embodiment of the present disclosure.

Therefore, in S830, the mapping function is determined according to the first sequence obtained in S810 and the second sequence obtained in S820. In an embodiment, because elements are sorted in the first sequence in S820, the mapping function may be determined according to positions of each element in the first sequence and in the second sequence. That is, the mapping function is a function that indicates a mapping relationship between the positions of each element in the first sequence and in the second sequence.

As an example instead of a limitation, if a sequence E is [0, 7, 1], a sequence F obtained after performing sorting processing on the sequence A in ascending order is [0, 1, 7]. Therefore, a mapping rule (or a mapping function) q from the sequence E to the sequence F may be expressed as [0, 2, 1]. That is, the first element (whose sequence number is 0) in the sequence F is the first element (whose sequence number is 0) in the sequence E, the second element (whose sequence number is 1) in the sequence F is the third element (whose sequence number is 2) in the sequence E, and the third element (whose sequence number is 2) in the sequence F is the second element (whose sequence number is 1) in the sequence E.

Likewise, the mapping function may be obtained according to the obtained second sequence and the first sequence.

Therefore, in S840, the target polar code obtained in S810 may be interleaved based on the obtained mapping function.

As an example instead of a limitation, if the mapping function q is [0, 2, 1], a bit value of the first bit (whose sequence number is 0) in a sequence of the interleaved bits is a bit value of the first bit (whose sequence number is 0) in the bit sequence before the interleaving processing, a bit value of the second bit (whose sequence number is 1) in the sequence of the interleaved bits is a bit value of the third bit (whose sequence number is 2) in the bit sequence before the interleaving processing, and a bit value of the third bit (whose sequence number is 2) in the sequence of the interleaved bits is a bit value of the second bit (whose sequence number is 1) in the bit sequence before the interleaving processing.

Optionally, the polar code rate matching method 800 further includes performing reversing processing on the interleaved output bits.

In an embodiment, after a sequence of the interleaved output bits is obtained in S840, the reversing processing may be performed on the bit sequence. For example, if the interleaved bits are expressed as $\{a_0, a_1, \ldots, a_{N-1}\}$, reversed bits may be expressed as $\{a_{N-1}, a_{N-2}, \ldots, a_1, a_0\}$.

Optionally, the polar code rate matching method 800 further includes performing replacement processing on the interleaved output bits according to an information bit set of the polar code.

In an embodiment, after a sequence of the interleaved output bits is obtained in S840, the replacement processing may be performed on the interleaved bit sequence. The replacement processing in this embodiment of the present disclosure may be exchanging positions of some elements in the bit sequence with positions of other elements, or may be replacing an element with another element. This is not limited in this embodiment of the present disclosure. After the replacement processing, a set of zero-capacity bit channels of a punctured polar code with (N–K) punctured bits may be equal to a set of frozen bits. In this way, performance of the punctured polar code can be further improved.

It should be understood that, in this embodiment of the present disclosure, both the replacement processing and the reversing processing may be performed, and a sequence of performing the replacement processing and performing the reversing processing is not limited. Alternatively, only the replacement processing may be performed or only the reversing processing may be performed. This is not limited in this embodiment of the present disclosure.

Optionally, the polar code rate matching method 800 further includes determining, according to a redundancy version RV parameter, a sending bit transmitted in HARQ retransmission.

In an embodiment, after the interleaving processing (or the interleaving and reversing processing, or the interleaving and replacement processing, or the interleaving, reversing, and replacement processing), for example, the output bits may be sent to a circular buffer (circular buffer), and a start position of the current transmitted bit in the circular buffer is determined according to a RV parameter corresponding to a current HARQ transmission. In addition, a length of the current transmitted bit may be determined according to a transmission resource or a preset rule. Therefore, the sending bit that needs to be transmitted in the current HARQ transmission, that is, an output bit of rate matching processing, may be determined. That is, the start position and the bit length that are of the sending bit in the interleaved output bits are determined according to the redundancy version RV parameter to determine the sending bit.

Optionally, the polar code rate matching method 800 further includes determining, from the interleaved output bits by means of sequential capturing or repetition, a sending bit that needs to be transmitted in HARQ retransmission.

In an embodiment, a start position that is of a bit transmitted in each time of HARQ retransmission and that is in the output bits obtained after the interleaving processing (or the interleaving and reversing processing, or the interleaving and replacement processing, or the interleaving, reversing, and replacement processing) is determined according to a transmission resource or a preset rule and using a counter, a circular buffer, or the like. Therefore, a bit in each time of retransmission may be determined in a manner of sequential capturing or repetition.

Figure 9:
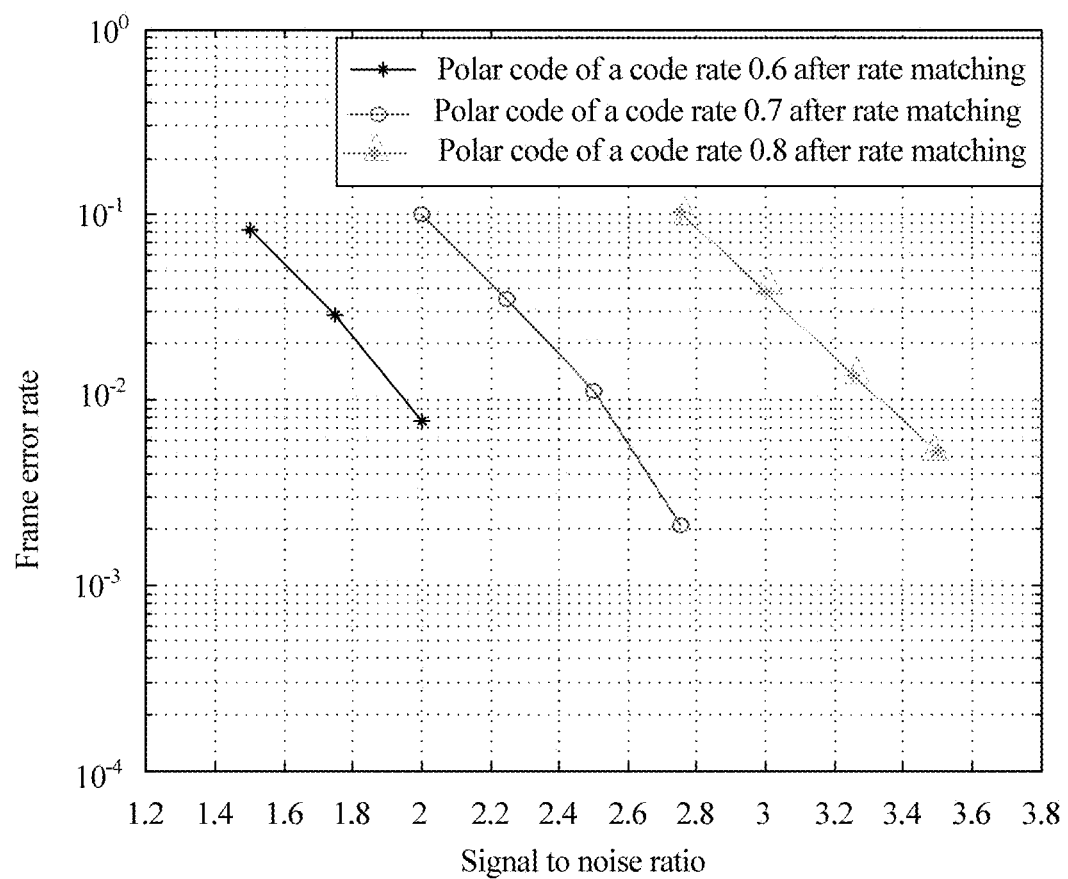
FIG. 9 is a schematic diagram of a simulation result of rate matching performance of a polar code that is processed based on a method in the present disclosure.

FIG. 9 shows rate matching performance of a polar code whose code length is 512 and information bit length is 256. As shown in FIG. 9, a polar code processed using the polar code rate matching method in the present disclosure has relatively high rate matching performance.

The following Table 1 shows rate matching performance of a polar code and a turbo code when a code length is 512 and an information bit length is 256. An information bit includes 24 Cyclic Redundancy Check (CRC) and P represents a quantity of punctured bits.

TABLE 1

|  | Code rate R = 0.5 | Code rate R = 0.6 (P = 85) | Code rate R = 0.7 (P = 146) | Code rate R = 0.8 (P = 192) |
| --- | --- | --- | --- | --- |
| Signal to noise ratio (dB) of a polar code | 1.5 | 1.95 | 2.5 | 3.3 |
| Signal to noise ratio (dB) of a turbo code | 2.5 | 3.1 | 3.8 | 4.6 |
| Gain (dB) of a polar code relative to a turbo code | 1.0 | 1.15 | 1.3 | 1.3 |

As shown in FIG. 9, with a same code length, a same information bit length, and a same code rate, rate matching performance of a polar code processed using the polar code rate matching method in the present disclosure is obviously better than rate matching performance of a turbo code.

Therefore, according to the polar code rate matching method in this embodiment of the present disclosure, a first sequence is determined based on a Mersenne twister algorithm and according to a code length of a target polar code, a mapping function is determined by performing sorting on the first sequence, and rate matching for the target polar code is implemented based on the mapping function. Therefore, a bit sequence obtained from the rate matching can be more even in structure, a frame error rate of a punctured polar code can be reduced, HARQ performance can be improved, and further, communication reliability can be improved. In addition, the polar code rate matching method can be applicable to a rate matching process for polar codes of various code lengths, and has high universality and practicability.

It should be understood that sequence numbers of the processes do not mean execution sequences in various embodiments of the present disclosure. The execution sequences of the processes should be determined according to functions and internal logic of the processes, and should not be construed as any limitation on the implementation processes of the embodiments of the present disclosure.

In addition, the term "and/or" in this specification describes only an association relationship for describing associated objects and represents that three relationships may exist. For example, A and/or B may represent the following three cases Only A exists, both A and B exist, and only B exists. In addition, the character "l" in this specification generally indicates an "or" relationship between the associated objects.

Examples of one or more embodiments are described above. Certainly, it is impossible to describe all possible combinations of components or methods to describe the embodiments, but a person of ordinary skill in the art should know that the embodiments may be further combined and modified. Therefore, the embodiments described in this application are intended to include all changes, modifications, and variations falling within the spirit and the protection scope of the appended claims. In addition, for the term "include" used in the specification or the claims, meaning included in the term is similar to that included in the term "comprise", and is like that of the term "comprise" explained as a connecting term in the claims.

A person of ordinary skill in the art may be aware that, in combination with the examples described in the embodiments disclosed in this specification, units and algorithm steps may be implemented by electronic hardware, computer software, or a combination thereof. To clearly describe the interchangeability between the hardware and the software, the foregoing has generally described compositions and steps of each example according to functions. Whether the functions are performed by hardware or software depends on particular applications and design constraint conditions of the technical solutions. A person skilled in the art may use different methods to implement the described functions for each particular application, but it should not be considered that the implementation goes beyond the scope of the present disclosure.

It may be clearly understood by a person skilled in the art that, for the purpose of convenient and brief description, for a detailed working process of the foregoing system, apparatus, and unit, reference may be made to a corresponding process in the foregoing method embodiments, and details are not described herein.

In the several embodiments provided in this application, it should be understood that the disclosed system, apparatus, and method may be implemented in other manners. For example, the described apparatus embodiment is merely an example. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented through some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. A part or all of the units may be selected according to actual needs to achieve the objectives of the solutions of the embodiments of the present disclosure.

In addition, functional units in the embodiments of the present disclosure may be integrated into one processing unit. Each of the units may exist alone physically, or two or more units are integrated into one unit. The integrated unit may be implemented in a form of hardware, or may be implemented in a form of a software functional unit.

When the integrated unit is implemented in the form of a software functional unit and sold or used as an independent product, the integrated unit may be stored in a computer-readable storage medium. Based on such an understanding, the technical solutions of the present disclosure essentially, or the part contributing to the prior art, or all or a part of the technical solutions may be implemented in the form of a software product. The software product is stored in a storage medium and includes several instructions for instructing a computer device (which may be a personal computer, a server, or a network device) to perform all or a part of the steps of the methods described in the embodiments of the present disclosure. The foregoing storage medium includes any medium that can store program code, such as a universal serial bus (USB) flash drive, a removable hard disk, a ROM a RAM, a magnetic disk, or an optical disc.

The foregoing descriptions are merely specific embodiments of the present disclosure, but are not intended to limit the protection scope of the present disclosure. Any modification or replacement readily figured out by a person skilled in the art within the technical scope disclosed in the present disclosure shall fall within the protection scope of the present disclosure. Therefore, the protection scope of the present disclosure shall be subject to the protection scope of the claims.

What is claimed is:

1. An apparatus, comprising:
a memory configured to store instructions; and
a processor coupled to the memory and configured to execute the instructions, which cause the processor to be configured to:
determine a first sequence based on a Mersenne twister algorithm according to a code length of a target polar code and data bits that are to be sent by the apparatus;
perform a sort function on the first sequence based on a preset rule to determine a second sequence;
interleave the target polar code according to a mapping function to generate interleaved output bits, wherein the mapping function is determined according to the first sequence and the second sequenced; and
transmitting the interleaved output bits to a wireless communication device.

2. The apparatus according to claim 1, wherein the processor is further configured to determine the first sequence according to the following formulas:

$$X_{k+n} := X_{k+m} \oplus (X_k^{w-r} | X_{k+1}^r) A$$

$$V_k := X_{k+n} \oplus (X_{k+n} >> u)$$

$$H_k := V_k \oplus ((V_k << s) \& B)$$

$$Y_k := H_k \oplus ((H_k << t) \& C)$$

$$Z_k := Y_k \oplus (Y_k >> l)$$

wherein Z is the first sequence, V, H and Y are intermediate variables, $X_0, X_1, \ldots, X_{n-1}$ are n non-zero original integers, the non-zero original integer has w digits, $X_k^{w-r} | X_{k+1}^r$ represents an integer that has w digits and that is formed by sequentially splicing first (w−r) digits of $X_k$ and last r digits of $X_{k+1}$, $$A = \begin{pmatrix} & 1 & & & \\ & & 1 & & \\ & & & \ddots & \\ & & & & 1 \\ a_{w-1} & a_{w-2} & \ldots & \ldots & a_0 \end{pmatrix},$$

$a_{w-1}, a_{w-2}, \ldots a_0$ are specific parameters used for bit shifting, n, m, w, r u, s, t, and l are specific positive integers, m is less than n, r is less than w, B and C are specific sequences, k is successively $0, 1, \ldots, N-1$, and N is the code length of the target polar code.

3. The apparatus according to claim 2, wherein n=624, m=397, w=32, r=31, u=11, s=7, t=15, l=18, B=0x9d2c5680, and C=0xefc60000.

4. The apparatus according to claim 1, wherein the processor is further configured to perform reversing processing on the interleaved output bits.

5. The apparatus according to claim 1, wherein the processor is further configured to perform replacement processing on the interleaved output bits according to an information bit set of the polar code.

6. The apparatus according to claim 1, wherein the processor is further configured to determine, according to a redundancy version (RV) parameter, a sending bit transmitted in hybrid automatic repeat request (HARQ) retransmission.

7. The apparatus according to claim 1, wherein the processor is further configured to determine, from the interleaved output bits, a sending bit that needs to be transmitted in hybrid automatic repeat request (HARQ) retransmission.

8. A wireless communications device, comprising:
a memory configured to store instructions; and
a processor configured to execute the instructions, which causes the processor to be configured to:
determine a first sequence based on a Mersenne twister algorithm according to a code length of a target polar code and data bits;
perform a sort function on the first sequence based on a preset rule to determine a second sequence;
interleave the target polar code according to a mapping function to generate interleaved output bits, wherein the mapping function is determined according to the first sequence and the second sequence; and
transmit the interleaved output bits to another wireless communication device.

9. The wireless communications device according to claim 8, wherein the instructions further cause the processor to determine the first sequence according to the following formulas:

$$X_{k+n} := X_{k+m} \oplus (X_k^{w-r} | X_{k+1}^r) A$$

$$V_k := X_{k+n} \oplus (X_{k+n} >> u)$$

$$H_k := V_k \oplus ((V_k << s) \& B)$$

$$Y_k := H_k \oplus ((H_k << t) \& C)$$

$$Z_k := Y_k \oplus (Y_k >> l)$$

wherein Z is the first sequence, V, H and Y are intermediate variables, $X_0, X_1, \ldots, X_{n-1}$ are n non-zero original integers, the non-zero original integer has W digits, $X_k^{w-r} | X_{k+1}^r$ represents an integer that has w digits and that is formed by sequentially splicing first (w−r) digits of $X_k$ and last r digits of $X_{k+1}$, $$A = \begin{pmatrix} & 1 & & & \\ & & 1 & & \\ & & & \ddots & \\ & & & & 1 \\ a_{w-1} & a_{w-2} & \ldots & \ldots & a_0 \end{pmatrix},$$

$a_{w-1}, a_{w-2}, \ldots a_0$ are specific parameters used for bit shifting, n, m, w, r u, s, t, and l are specific positive integers, m is less than n, r is less than w, B and C are specific sequences, k is successively $0, 1, \ldots, N-1$, and N is the code length of the target polar code.

10. The wireless communications device according to claim 9, wherein n=624, m=397, w=32, r=31, u=11, s=7, t=15, l=18, B=0x9d2c5680, and C=0xefc60000.

11. The wireless communications device according to claim 8, wherein the instructions further cause the processor to perform reverse processing on the interleaved output bits.

12. The wireless communications device according to claim 8, wherein the instructions further cause the processor to perform replacement processing on the interleaved output bits according to an information bit set of the polar code.

13. The wireless communications device according to claim 8, wherein the instructions further cause the processor to perform determining, according to a redundancy version (RV) parameter, a sending bit transmitted in hybrid automatic repeat request (HARQ) retransmission.

14. The wireless communications device according to claim 8, wherein the instructions further cause the processor to determine, from the interleaved output bits, a sending bit that needs to be transmitted in hybrid automatic repeat request (HARQ) retransmission.

15. A method implemented by an apparatus, comprising:
determining a first sequence based on a Mersenne twister algorithm according to a code length of a target polar code and data bits;
performing a sort function on the first sequence based on preset rule to determine a second sequence;
interleaving the target polar code according to a mapping function to generate interleaved output bits by the wireless communications device, wherein the mapping function is determined according to the first sequence and the second sequence;
transmitting the interleaved output bits to another wireless communication device.

16. The method according to claim 15, wherein determining, based on the Mersenne twister algorithm, the first sequence according to the code length of the target polar code comprises determining the first sequence according to the following formulas:

$X_{k+n} := X_{k+m} \oplus (X_k^{w-r} | X_{k+1}^r) A$ $V_k := X_{k+n} \oplus (X_{k+n} >> u)$ $H_k := V_k \oplus ((V_k << s) \& B)$ $Y_k := H_k \oplus ((H_k << t) \& C)$ $Z_k := Y_k \oplus (Y_k >> l)$ wherein Z is the first sequence, V, H and Y are intermediate variables, $X_0, X_1, \ldots, X_{n-1}$ are n non-zero original integers, the non-zero original integer has w digits, $X_k^{w-r} | X_{k+1}^r$ represents an integer that has w digits and that is formed by sequentially splicing first (w−r) digits of $X_k$ and last r digits of $X_{k+1}$ $$A = \begin{pmatrix} & 1 & & & \\ & & 1 & & \\ & & & \ddots & \\ & & & & 1 \\ a_{w-1} & a_{w-2} & \cdots & \cdots & a_0 \end{pmatrix},$$

$a_{w-1}, a_{w-2}, \ldots a_0$ are specific parameters used for bit shifting, n, m, w, r u, s, t, and l are specific positive integers, m is less than n, r is less than w, B and C are specific sequences, k is successively $0, 1, \ldots, N-1$, and N is the code length of the target polar code.

17. The method according to claim 16, wherein n=624, m=397, w=32, r=31, u=1, s=7, t=15, l=18, B=0x9d2c5680, and C=0xefc60000.

18. The method according to claim 15, wherein the polar code rate matching method further comprises performing reversing processing on the interleaved output bits.

19. The method according to claim 15, wherein the polar code rate matching method further comprises performing replacement processing on the interleaved output bits according to an information bit set of the polar code.

20. The method according to claim 15, wherein the polar code rate matching method further comprises determining, according to a redundancy version (RV) parameter, a start position that is in the interleaved output bits and that is of a sending bit transmitted in hybrid automatic repeat request (HARQ) retransmission.

21. The method according to claim 15, wherein the polar code rate matching method further comprises determining, from the interleaved output bits, a sending bit that needs to be transmitted in hybrid automatic repeat request (HARQ) retransmission.

* * * * *

UNITED STATES PATENT AND TRADEMARK OFFICE
CERTIFICATE OF CORRECTION

PATENT NO. : 10,374,754 B2  
APPLICATION NO. : 15/608060  
DATED : August 6, 2019  
INVENTOR(S) : Hui Shen and Bin Li Page 1 of 1

It is certified that error appears in the above-identified patent and that said Letters Patent is hereby corrected as shown below:

On the Title Page $2^{nd}$ Page, $2^{nd}$ Column, Line 18: "KP032727166" should read "XP032727166"

In the Claims

Claim 2, Column 27, Line 22: "$(X_{k+1}{}^r)$" should read "$(X^r{}_{k+1})$"

Claim 2, Column 27, Line 33: "$(X_{k+1}{}^r)$" should read "$(X^r{}_{k+1})$"

Claim 2, Column 27, Line 47: "m, w, r u, s, t" should read "m, w, r, u, s, t"

Claim 9, Column 28, Line 22: "$(X_{k+1}{}^r)$" should read "$(X^r{}_{k+1})$"

Claim 9, Column 28, Line 33: "$(X_{k+1}{}^r)$" should read "$(X^r{}_{k+1})$"

Claim 9, Column 28, Line 47: "m, w, r u, s, t" should read "m, w, r, u, s, t"

Claim 16, Column 29, Line 22: "$(X_{k+1}{}^r)$" should read "$(X^r{}_{k+1})$"

Claim 16, Column 29, Line 33: "$(X_{k+1}{}^r)$" should read "$(X^r{}_{k+1})$"

Claim 16, Column 30, Line 10: "m, w, r u, s, t" should read "m, w, r, u, s, t"

Signed and Sealed this  
First Day of October, 2019

Andrei Iancu  
*Director of the United States Patent and Trademark Office*